United States Patent
Ha et al.

(10) Patent No.: US 11,139,197 B2
(45) Date of Patent: Oct. 5, 2021

(54) METHOD OF FABRICATING SEMICONDUCTOR DEVICE

(71) Applicant: Samsung Electronics Co., Ltd., Suwon-si (KR)

(72) Inventors: Kyungyeon Ha, Hwaseong-si (KR); Yong-Ho Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/910,493

(22) Filed: Jun. 24, 2020

(65) Prior Publication Data

US 2021/0143158 A1    May 13, 2021

(30) Foreign Application Priority Data

Nov. 11, 2019   (KR) .................. 10-2019-0143334

(51) Int. Cl.
  *H01L 21/8234*    (2006.01)
  *H01L 21/74*    (2006.01)
  (Continued)

(52) U.S. Cl.
  CPC ........ *H01L 21/74* (2013.01); *H01L 21/31111* (2013.01); *H01L 21/31116* (2013.01); *H01L 21/76224* (2013.01); *H01L 21/823431* (2013.01); *H01L 21/823475* (2013.01); *H01L 21/845* (2013.01); *H01L 27/10855* (2013.01);
  (Continued)

(58) Field of Classification Search
  CPC ..... H01L 21/823431; H01L 21/823475; H01L 21/31111; H01L 21/845; H01L 21/31116; H01L 21/32139; H01L 21/823456; H01L 27/10891; H01L 21/76224; H01L 21/74; H01L 27/10885; H01L 27/10855; H01L 27/10888; H01L 27/10823
  See application file for complete search history.

(56) References Cited

U.S. PATENT DOCUMENTS 7,767,565 B2   8/2010  Chung
8,288,263 B2  10/2012  Kim et al.
       (Continued)

FOREIGN PATENT DOCUMENTS

KR        100905173 B1    6/2009
KR     1020090104971 A   10/2009
KR        101800419 B1   11/2017

OTHER PUBLICATIONS

J. Kiihamaki et al., "Depth and profile control in plasma etched MEMS structures," vol. 82, Issues 1-3, pp. 234-238, May 15, 2000.

*Primary Examiner* — Shouxiang Hu
(74) *Attorney, Agent, or Firm* — Muir Patent Law, PLLC

(57) ABSTRACT

A method of fabricating a semiconductor device includes forming a device isolation layer in a substrate to define a plurality of active regions extending in a first direction; forming a trench in an upper portion of the substrate that crosses the active regions in a second direction that intersects the first direction; forming a sacrificial layer that fills the trench; forming support patterns on the sacrificial layer, wherein the support patterns fill recessed regions provided at a top surface of the sacrificial layer; and removing the sacrificial layer. The support patterns are spaced apart from each other with the active regions interposed therebetween.

20 Claims, 23 Drawing Sheets

(51) Int. Cl.
  *H01L 27/108*  (2006.01)
  *H01L 21/762*  (2006.01)
  *H01L 21/311*  (2006.01)
  *H01L 21/84*   (2006.01)

(52) U.S. Cl.
  CPC .. *H01L 27/10885* (2013.01); *H01L 27/10888* (2013.01); *H01L 27/10891* (2013.01); *H01L 27/10823* (2013.01)

(56) References Cited

U.S. PATENT DOCUMENTS

| | | |
|---|---|---|
| 8,610,191 B2 | 12/2013 | Moon et al. |
| 8,912,629 B2 | 12/2014 | Seo |
| 9,099,473 B2 | 8/2015 | Kim et al. |
| 9,171,670 B2 | 10/2015 | Lim |
| 9,331,140 B2 | 5/2016 | Park et al. |
| 10,115,640 B2 | 10/2018 | Hwang et al. |
| 10,164,032 B2 * | 12/2018 | Lee ............ H01L 29/0676 |
| 10,217,747 B2 * | 2/2019 | Kim ............ H01L 27/10814 |
| 10,256,136 B2 | 4/2019 | Kim et al. |
| 2012/0025300 A1 * | 2/2012 | Chung ......... H01L 27/10876 257/330 |

* cited by examiner

METHOD OF FABRICATING SEMICONDUCTOR DEVICE

CROSS-REFERENCE TO RELATED APPLICATIONS

This U.S. non-provisional patent application claims priority under 35 U.S.C. § 119 to Korean Patent Application No. 10-2019-0143334, filed on Nov. 11, 2019, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including buried gate lines and a method of fabricating the same.

Due to their small-sized, multifunctional, and/or low-cost characteristics, semiconductor devices are being esteemed as important elements in the electronic industry. In the recent electronics industry, highly integrated semiconductor devices are strongly demanded. It is important to reduce line widths of patterns in the semiconductor device, in order to manufacture highly integrated semiconductor devices. However, in order to reduce the linewidths of patterns, it is important to develop a novel and expensive lithography technology, which may lead to a big difficulty in increasing an integration density of a semiconductor memory device. Recently, a variety of new technologies are being studied to alleviate the difficulty in increasing an integration density of a semiconductor memory device.

SUMMARY

An embodiment of the inventive concept provides a method of fabricating a semiconductor device with buried gate lines.

According to an embodiment of the inventive concept, a method of fabricating a semiconductor device includes forming a device isolation layer in a substrate to define a plurality of active regions extending in a first direction; forming a trench in an upper portion of the substrate that crosses the active regions in a second direction that intersects the first direction; forming a sacrificial layer that fills the trench; forming support patterns on the sacrificial layer, wherein the support patterns fill recessed regions provided at a top surface of the sacrificial layer; and removing the sacrificial layer. The support patterns are spaced apart from each other with the active regions interposed therebetween.

According to an embodiment of the inventive concept, a method of fabricating a semiconductor device includes forming a device isolation layer in a substrate to define a plurality of active regions extending in a first direction; forming a trench in an upper portion of the substrate, wherein the trench crosses the active regions in a second direction that intersects the first direction; forming a sacrificial layer that fills the trench; forming support patterns on the sacrificial layer; and removing the sacrificial layer. The forming of the sacrificial layer comprises filling the trench with a sacrificial material and etching a portion of the sacrificial material, and the support patterns fill recessed regions provided at a top surface of the sacrificial layer.

According to an embodiment of the inventive concept, a method of fabricating a semiconductor device includes forming a device isolation layer in a substrate to define active regions extending in a first direction; forming trenches in an upper portion of the substrate to cross the active regions in a second direction that intersects the first direction; forming a sacrificial layer that fills the trenches; forming support patterns on the sacrificial layer; removing the sacrificial layer and exposing the trenches; forming a plurality of word lines in the trenches; forming a first contact that is connected to each of the active regions, and forming a plurality of bit line structures, that are in contact with the first contact and extend in a third direction perpendicular to the second direction; forming a second contact, at a region between adjacent word lines of the plurality of word lines and adjacent bit line structures of the plurality of bit line structures, wherein the second contact is connected to each of the active regions; and forming a data storing element on the second contact. The support patterns fill recessed regions, which are provided at a top surface of the sacrificial layer, each of the trenches comprises first regions and second regions, each region of which is formed between adjacent active regions of the plurality of active regions, and third regions, each of which vertically overlaps the active regions, a width of each of the first regions in the second direction is larger than a width of each of the second regions in the second direction, and each of the first regions vertically overlaps one of the support patterns.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the exact structural or performance characteristics of any given embodiment, and therefore should not be interpreted as defining or limiting the range of values or properties encompassed by the example embodiments. For example, the relative thicknesses and positioning of molecules, layers, regions, and/or structural elements may be reduced and/or exaggerated for clarity and ease of understanding. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

FIGS. 1A, 2A, 3A, 5A, and 8A are plan views illustrating a semiconductor device according to various example embodiments of the inventive concept and a method of fabricating the same. FIGS. 1B, 2B, 3B, 4A, 5B, 6A, 7A, and 8B are sectional views, which are taken along lines I-I' in the corresponding plan views. FIGS. 1C, 2C, 3C, 4B, 5C, 6B, 7B, and 8C are sectional views, which are taken along lines II-II' in the corresponding plan views. Hereinafter, a method of fabricating a semiconductor device according to an example embodiment of the inventive concept will be described in more detail with reference to the figures.

Figure 1A:
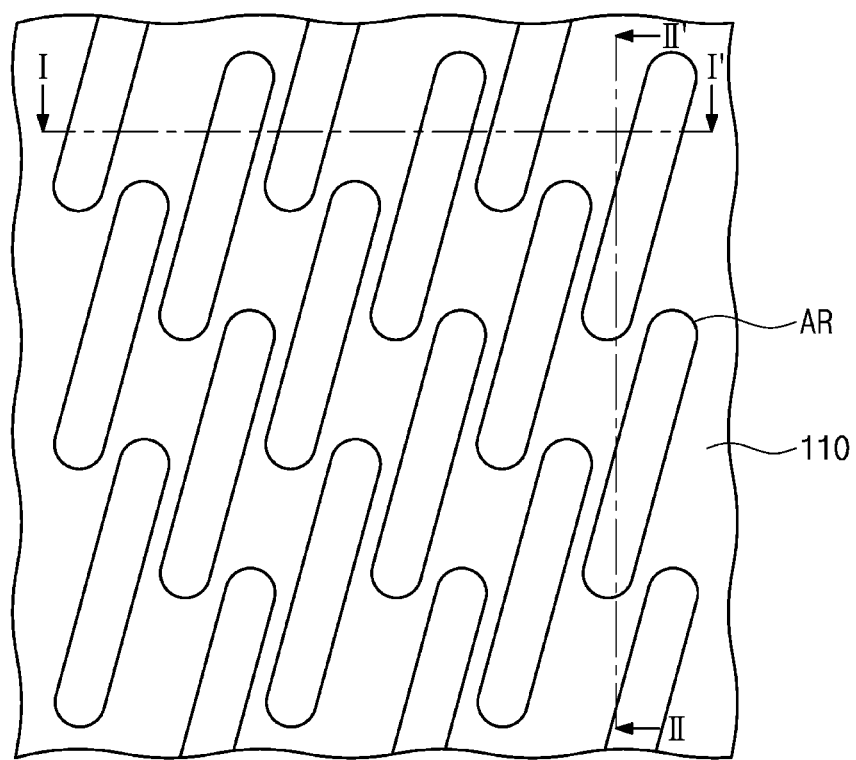
FIGS. 1A, 2A, 3A, 5A, and 8A are plan views illustrating a semiconductor device according to various example embodiments of the inventive concept and a method of fabricating the same.
Figure 1A:
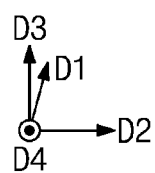
Figure 1B:
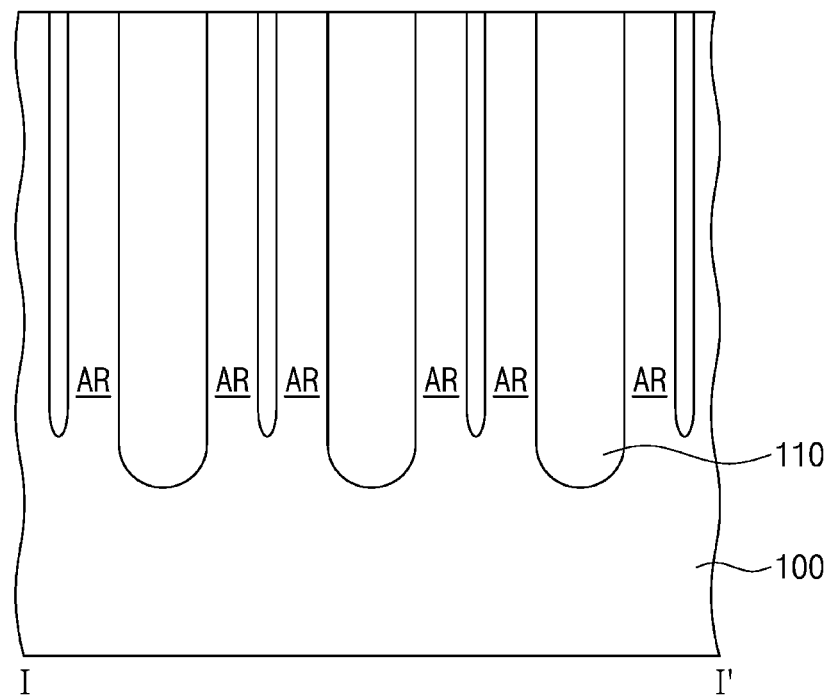
FIGS. 1B, 2B, 3B, 4A, 5B, 6A, 7A, 8B, and 9A are sectional views, which are taken along lines I-I' in the corresponding plan views to illustrate a semiconductor device according to example embodiments of the inventive concept and a method of fabricating the same.
Figure 1B:
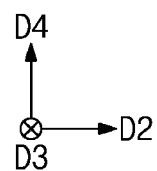
Figure 1C:
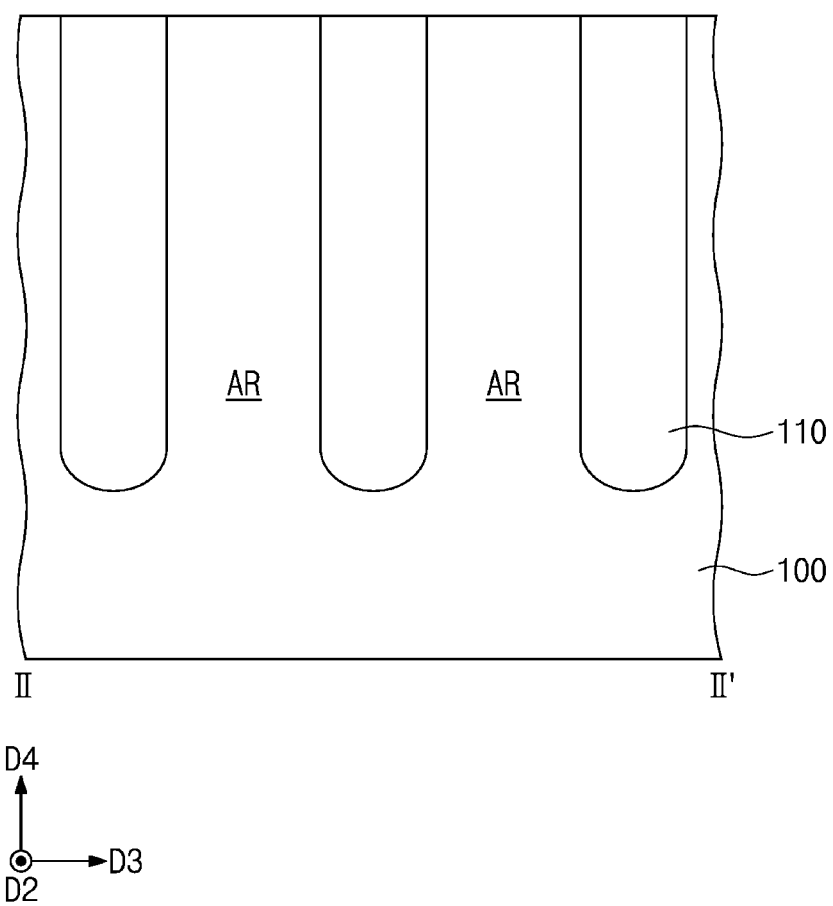
FIGS. 1C, 2C, 3C, 4B, 5C, 6B, 7B, 8C, and 9B are sectional views, which are taken along lines II-II' in the corresponding plan views to illustrate a semiconductor device according to example embodiments of the inventive concept and a method of fabricating the same.

Referring to FIGS. 1A, 1B, and 1C, a device isolation layer 110 may be formed in a substrate 100. Active regions AR may be defined by the device isolation layer 110. The active regions AR may extend in a first direction D1, when viewed in a plan view. The active regions AR may extend from a bottom surface of the substrate 100 in a fourth direction D4, when viewed in a sectional view. Here, the fourth direction D4 may be a direction perpendicular to a top surface of the substrate 100. In an embodiment, the device isolation layer 110 may be formed by a shallow trench isolation (STI) process. A bottom surface of the device isolation layer 110 may be positioned at two or more different levels. As used herein, the term "level" may refer to a height or elevation measured from a common surface such as, for example, a bottommost surface of substrate 100. As an example, the level of the bottom surface of the device isolation layer 110 may be lower in elevation in a region where a distance between the active regions AR is relatively greater than in a region where a distance between the active regions AR is relatively smaller.

Source and drain regions may be formed in each of the active regions AR. The formation of the source and drain regions may include forming an ion injection mask on the substrate 100 and performing an ion implantation process to inject impurities into portions of the substrate 100 using the ion injection mask. In certain embodiments, the ion implantation process may be performed without the ion injection mask.

Figure 2A:
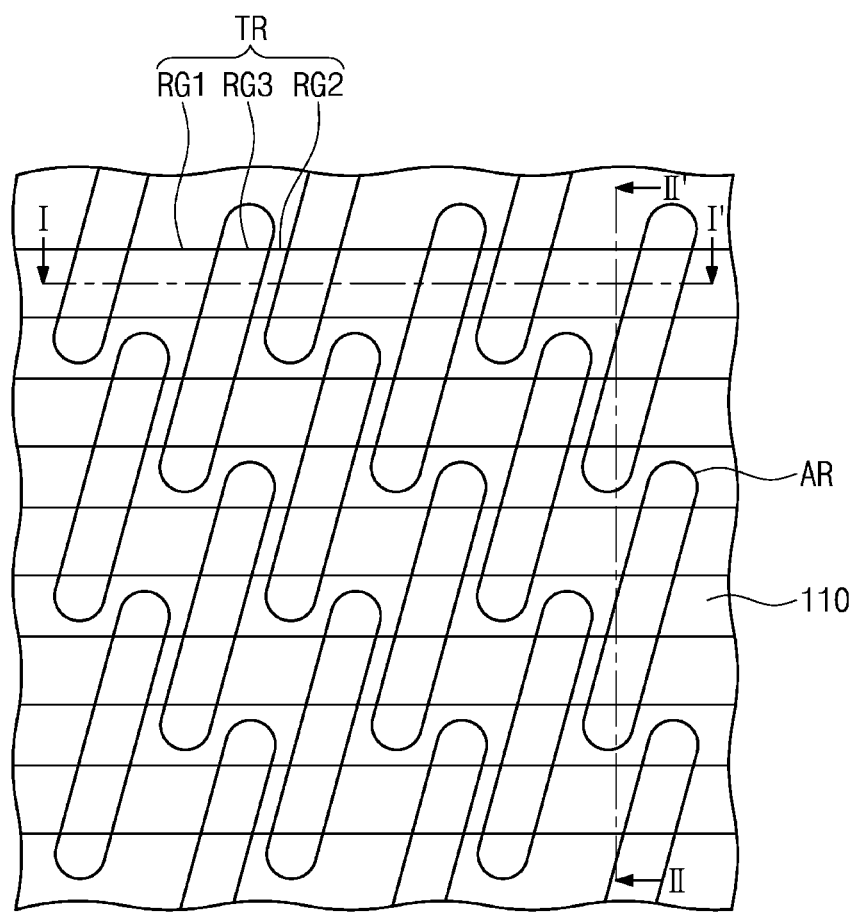
Figure 2A:
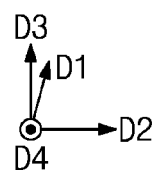
Figure 2B:
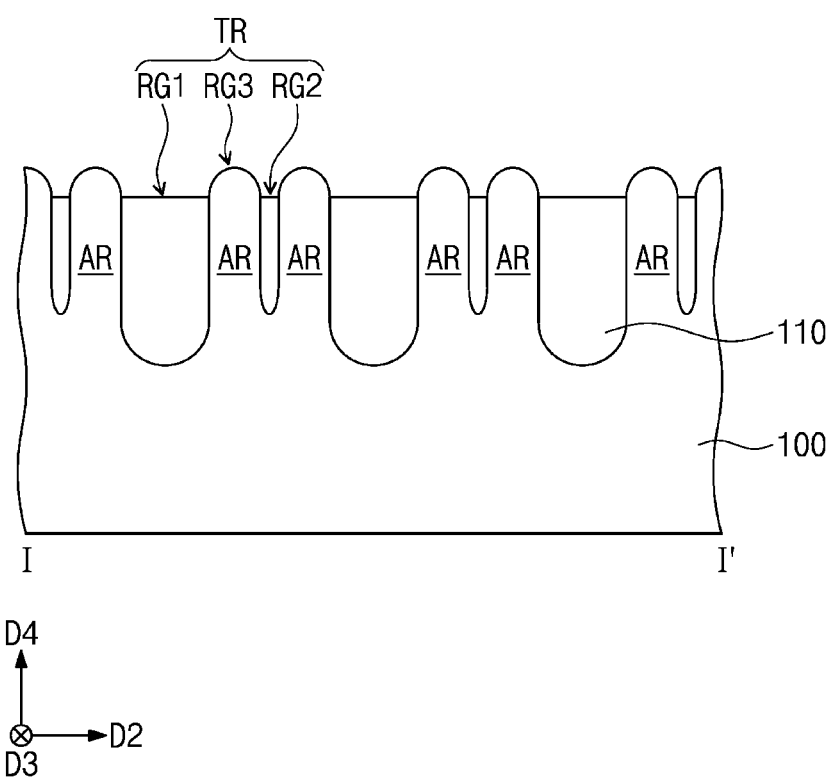
Figure 2C:
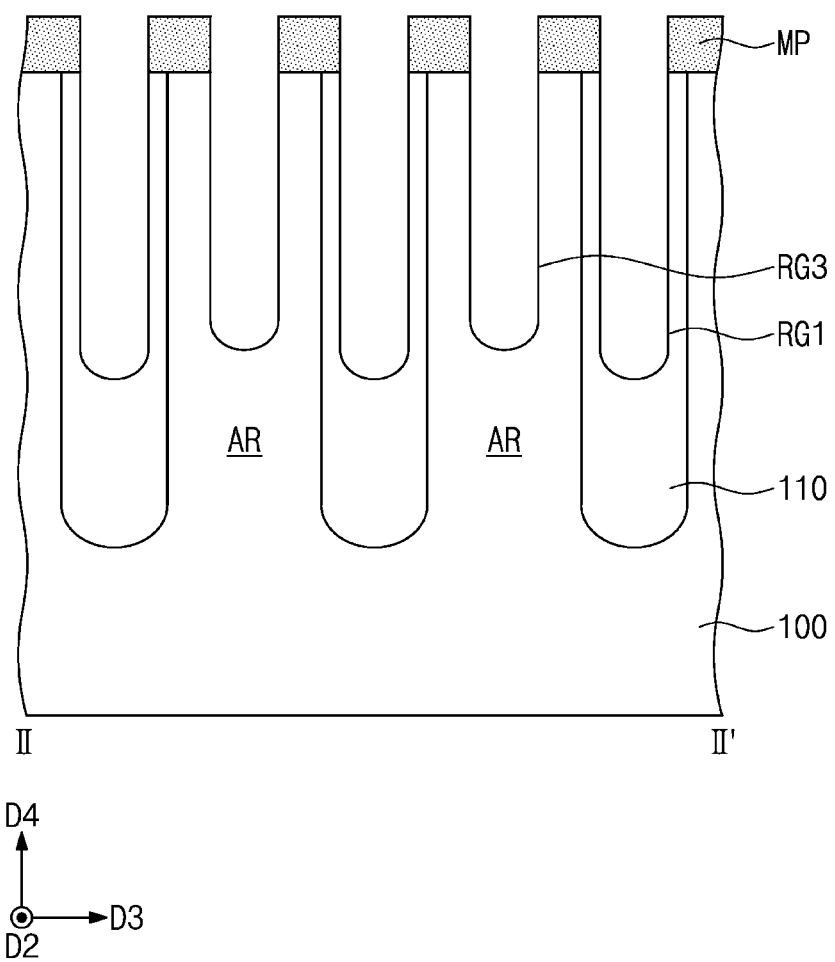

Referring to FIGS. 2A, 2B, and 2C, trenches TR may be formed to cross the active regions AR of the substrate 100. For example, trenches TR may be formed to pass over and/or pass through the active regions AR of the substrate 100. In an embodiment, each of the active regions AR may intersect a pair of the trenches TR. The trenches TR may be extended in a second direction D2, which is not parallel to the first direction D1, when viewed in a plan view. Each of the trenches TR may include a first region RG1, a second region RG2, and a third region RG3. In each of the trenches TR, the first region RG1 and the second region RG2 may be located between the active regions AR and may be lower in elevation or level than the topmost surfaces of the active regions AR (see FIG. 2B). In contrast, the third region RG3 may be located between the first region RG1 and the second region RG2 and may overlap with the active region AR (see FIG. 2B). Here, bottom surfaces of the first and second regions RG1 and RG2 may be defined by the device isolation layer 110, and a bottom surface of the third region RG3 may be defined by top surfaces of the active regions AR.

The formation of the trenches TR may include forming a mask pattern MP on the substrate 100 and etching the substrate 100 and the device isolation layer 110 using the mask pattern MP as an etch mask. In an embodiment, the mask pattern MP may be formed by, for example, a spin coating method. The mask pattern MP may include openings that are used to define positions and shapes for gate lines 200, which will be described later with reference to FIGS. 8B and 8C. The mask pattern MP may extend in the second direction D2 between the trenches TR. In an embodiment, the mask pattern MP may be a hard mask pattern including silicon nitride (SiNx) or a photoresist pattern.

The trenches TR may be formed to expose the top surface of each of the active regions AR and the top surface of the device isolation layer 110. In detail, the top surface of the device isolation layer 110 may be exposed through the first region RG1 and the second region RG2, and the top surface of each of the active regions AR may be exposed through the third region RG3.

Referring to FIGS. 2A, 2B, 2C, 3A, 3B, and 3C, the trenches TR may be partially enlarged. In an embodiment, an isotropic wet etching process may be performed to enlarge the trenches TR. Here, the device isolation layer 110 may be selectively etched using an etch selectivity (i.e., difference in etch rate) between the device isolation layer 110 and the active regions AR.

Figure 3A:
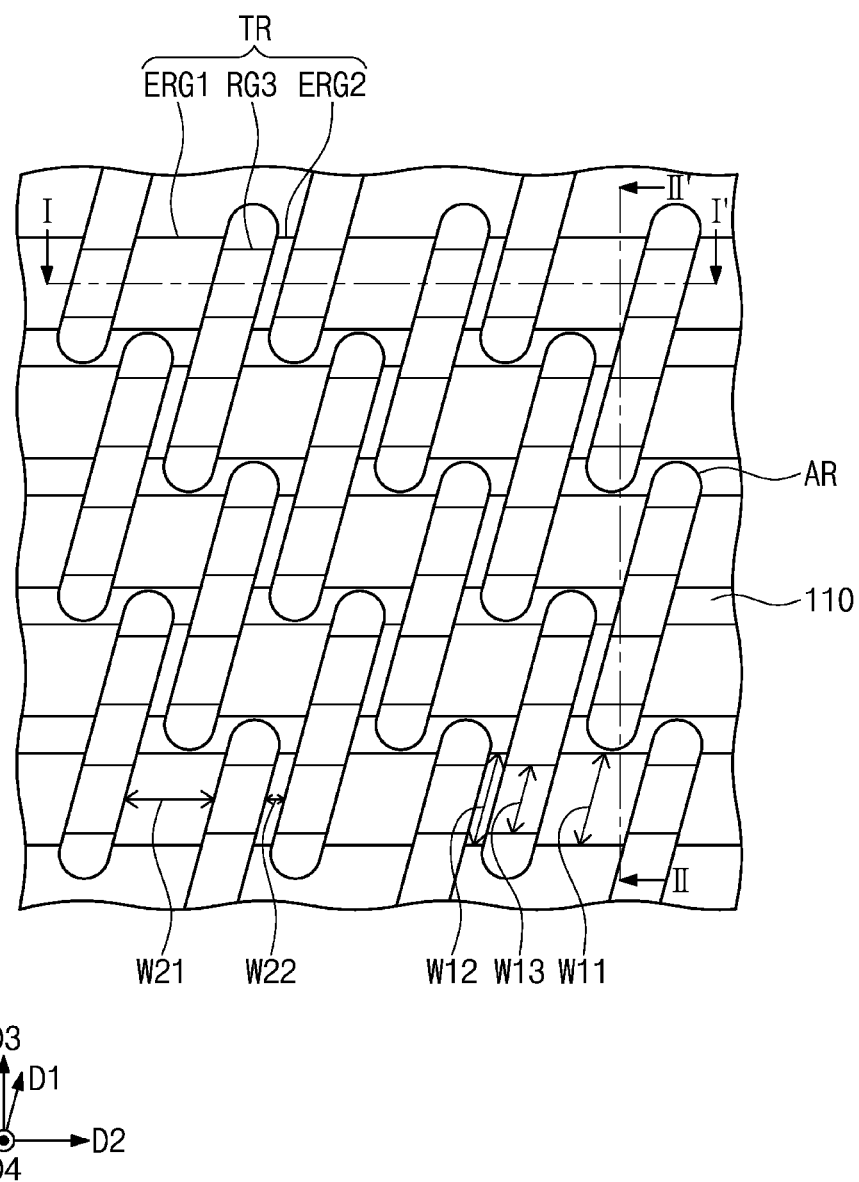
Figure 3B:
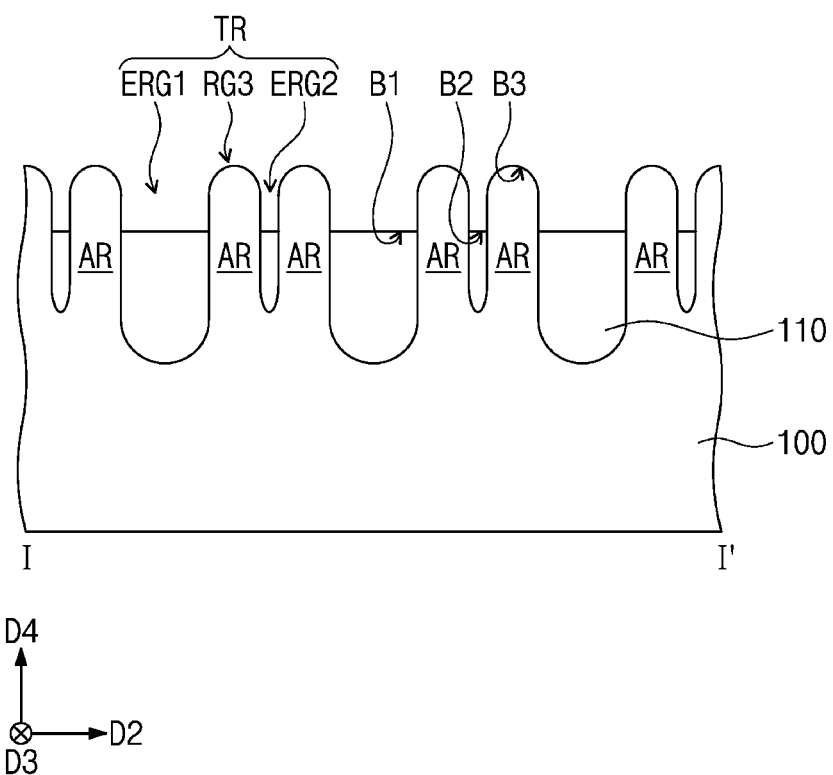
Figure 3C:
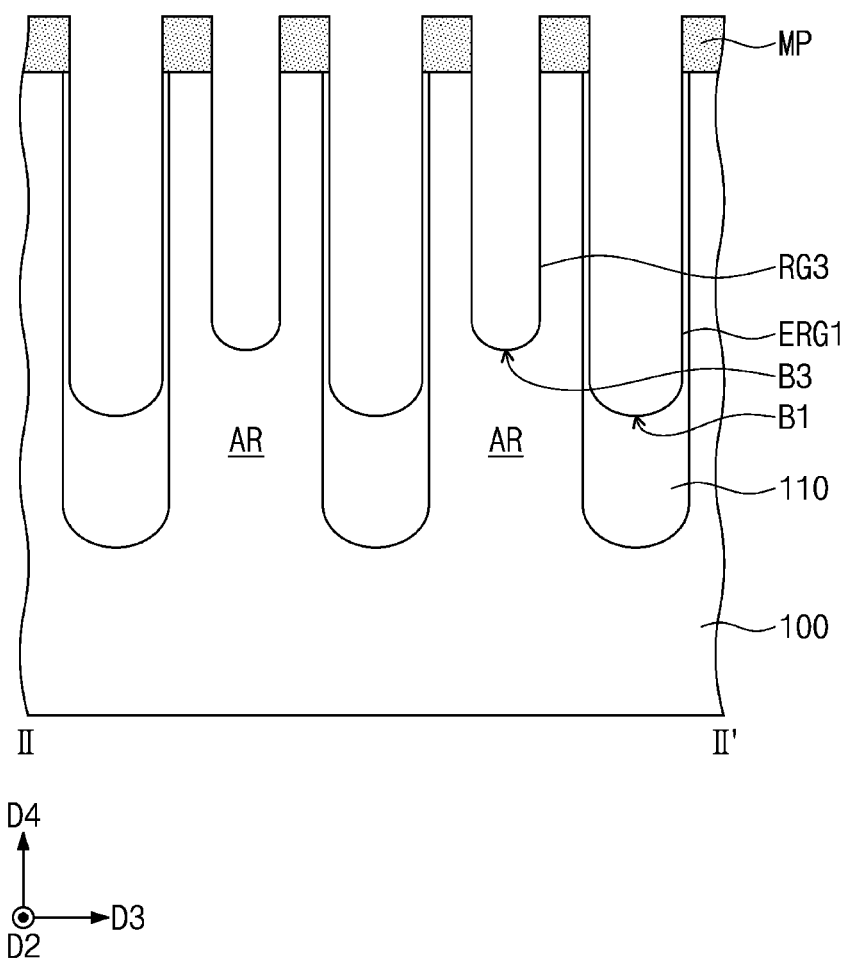

The first region RG1 and the second region RG2 may be enlarged to form a first enlarged region ERG1 and a second enlarged region ERG2, respectively (see FIG. 3A). Here, a bottom surface B1 of the first enlarged region ERG1 and a bottom surface B2 of the second enlarged region ERG2 may be defined by the device isolation layer 110. Additionally, in some embodiments the elevation of the top surface of the device isolation layer 110 may be substantially the same in the first enlarged region ERG1 and in the second enlarged region ERG2. As used herein, terms such as "same," "equal," "planar," or "coplanar," encompass near identicality including variations that may occur, for example, due to manufacturing processes. The term "substantially" may be used herein to emphasize this meaning, unless the context or other statements indicate otherwise.

When viewed in a plan view, some regions of each of the trenches TR may have widths increased in the first direction D1. In detail, a width W11 of the first enlarged region ERG1 in the first direction D1 may be larger than a width of the first region RG1 (from the previous step) in the first direction D1. Furthermore, a width W12 of the second enlarged region ERG2 in the first direction D1 may be larger than a width of the second region RG2 (from the previous step) in the first direction D1. Additionally, the width W11 of the first enlarged region ERG1 in the first direction D1 and the width W12 of the second enlarged region ERG2 in the first direction D1 may be larger than a width W13 of the third region RG3 in the first direction D1. In some embodiments, the width W11 and the width W12 may be substantially the same.

When viewed in a sectional view, top and side surfaces of the device isolation layer 110 exposed through the trenches TR may be etched. In detail, the bottom surface B1 of the first enlarged region ERG1 may be lower than the bottom surface of the first region RG1 (from the previous step). Furthermore, the bottom surface B2 of the second enlarged region ERG2 may be lower than the bottom surface of the second region RG2 (from the previous step). Although not shown in FIGS. 3B and 3C, a bottom surface B3 of the third region RG3 may also be lower in elevation than that of FIGS. 2B and 2C. When viewed in a sectional view, a width of the first enlarged region ERG1 in a third direction D3 may be larger than a width of the first region RG1 (from the previous step) in the third direction D3. Also, a width of the second enlarged region ERG2 in the third direction D3 may be larger than a width of the second region RG2 (from the previous step) in the third direction D3. The third direction D3 may be a direction that is parallel to the top surface of the substrate 100 and is also perpendicular to the second direction D2.

Figure 4A:
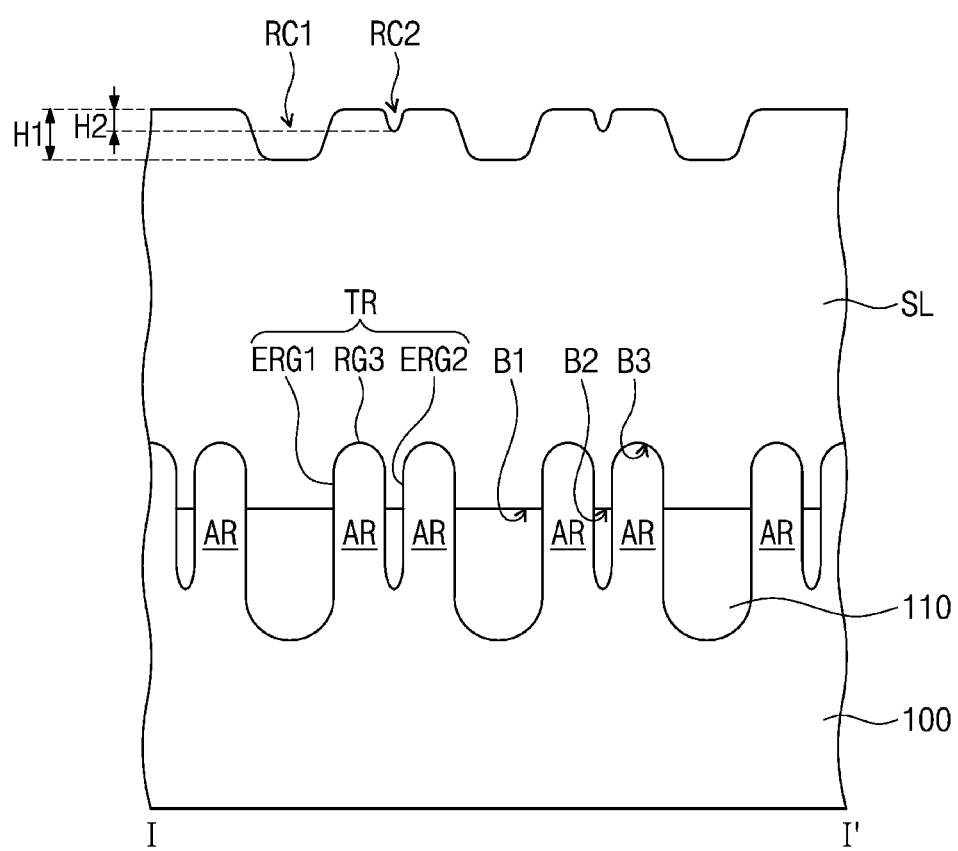
Figure 4B:
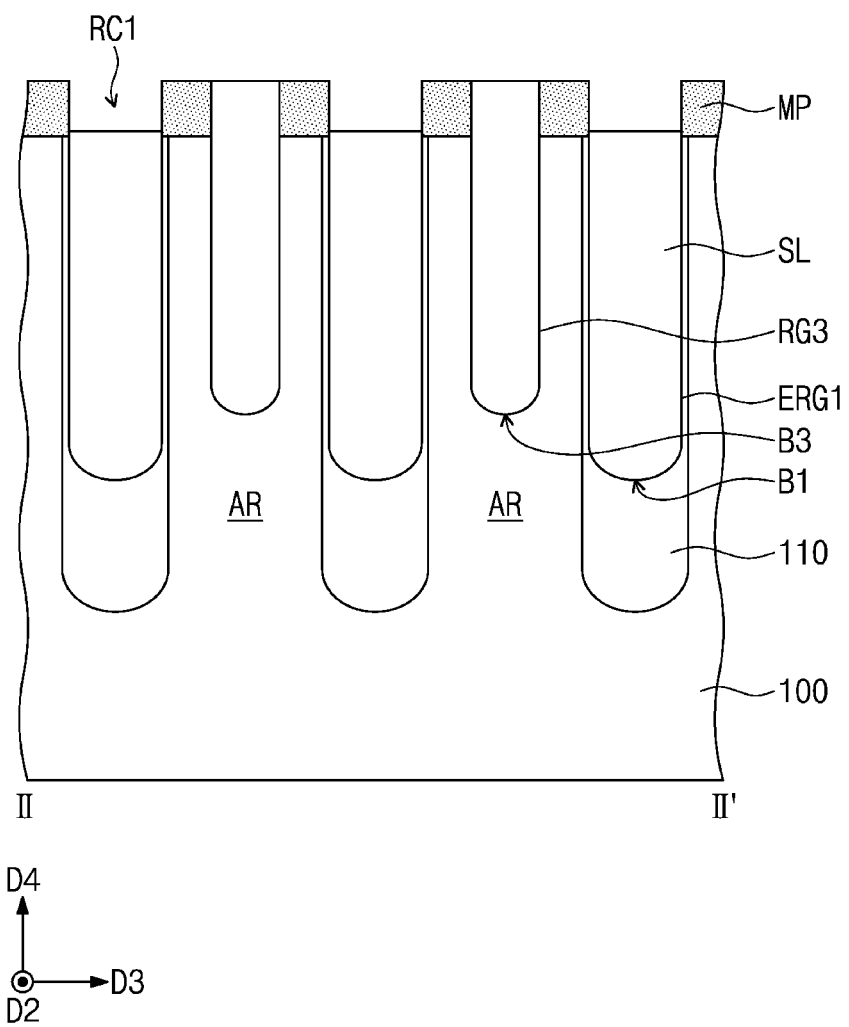

Referring to FIGS. 4A and 4B, a sacrificial layer SL may be formed to fill the trenches TR. For example, the sacrificial layer SL may completely fill the trenches TR. In an embodiment, the sacrificial layer SL may be formed by a gap-fill process of filling the trenches TR with a sacrificial material. The sacrificial material may be formed of or include, for example, poly silicon. However, the inventive concept is not limited to this example, and in an embodiment, the sacrificial material may be formed of a material that is chosen to have an etch selectivity with respect to first and second support patterns BS1 and BS2, which will be described with reference to FIGS. 5A and 5B. The gap-fill process may be performed using one of, for example, chemical vapor deposition (CVD), physical vapor deposition (PVD), atomic layer deposition (ALD), epitaxial growth, and spin coating methods. The sacrificial material filling the trenches TR may have a top surface with recessed regions. The recessed regions may be defined as a portion of the top surface of the sacrificial material at a level lower than the topmost surface of the sacrificial material. For example, the elevation of the top surface of the sacrificial material (sacrificial layer SL) in each recessed region may be lower in elevation or height than the topmost surface of the sacrificial material (sacrificial layer SL) when measured with respect to a common surface, e.g., the bottom most surface of substrate 100.

In the case where a chemical vapor deposition (CVD) method (e.g., a flowable chemical vapor deposition (FCVD) method) or a spin coating method is used to fill the trenches TR with the sacrificial material, a capillary effect may occur due to a surface tension. As an example, the spin coating method may be performed by a spin-on dielectric (SOD) method using polysilazane. In this case, a top surface of a portion of the sacrificial material, which is in contact with the side surface of the device isolation layer 110 or the side surfaces of the active regions AR, may be positioned at a level higher than a top surface of a portion of the sacrificial material, which is formed on a center region of each of the trenches TR.

The formation of the sacrificial layer SL may further include performing a partial-etching process to partially etch the sacrificial material, after the gap-fill process. The partial-etching process may be performed to etch portions of the sacrificial material near the recessed regions. For example, in the case where a FCVD method or a spin coating method is used for the gap-fill process, the recessed regions may be formed to have different aspect ratios (a ratio of height/depth to width), and this difference in aspect ratio between the recessed regions may lead to a large difference in etch rate between the recessed regions. The difference in etch rate between the recessed regions caused by their aspect ratios may result from a spatial variation in densification of the sacrificial material, which is caused by a difference in size or volume between the recessed regions in an annealing process. As a result, in the case where the difference in etch rate between the recessed regions caused by their aspect ratios is large, the etching process may lead to an increased difference in depth between the recessed regions. In an embodiment, the aspect ratio of each recessed region may be increased, compared to the aspect ratio before the etching process. For example, the partial etching process may be a wet etching process, which is performed using etching solution.

In addition, the formation of the sacrificial layer SL may further include performing a planarization process to pla-narize a portion of the top surface of the sacrificial material, between the gap-fill process and the process of partial etching the sacrificial material. After the planarization process, the entire top surface of the sacrificial material, except for the recessed regions, may be parallel to the top surface of the substrate 100. For example, a common uppermost surface of the sacrificial material that excludes the surfaces of the sacrificial material in the recessed regions may be parallel to the top surface of the substrate 100. Here, the planarization process may be performed by, for example, a chemical mechanical polishing (CMP) process or an etch-back process. In an embodiment, the planarization process may be omitted.

In an embodiment, the formation of the sacrificial layer SL may further include performing a process of additionally forming a sacrificial material, between the gap-fill process and the partial etching process. Hereinafter, the sacrificial material filling the trenches TR will be referred to as a first sacrificial material, and the additional sacrificial material, which is formed after the formation of the first sacrificial material, will be referred to as a second sacrificial material. The second sacrificial material may be a material different from the first sacrificial material. A thickness of the second sacrificial material may be smaller than (less than) a thickness of the first sacrificial material. In addition, the thickness of the second sacrificial material may be smaller than (less than) a largest depth H2, in the fourth direction D4, of a second recessed region RC2, which will be described in further detail below. The formation of the second sacrificial material may increase a difference in aspect ratio between the recessed regions. In certain embodiments, the process of forming the second sacrificial material may be omitted.

In the case where the sacrificial layer SL is formed by the gap-fill process, the sacrificial layer SL may have a partially-recessed top surface. For example, the top surface of the sacrificial layer SL may be formed to define a first recessed region RC1 and a second recessed region RC2. Though described in the singular, a plurality of first recessed regions RC1 and second recessed regions RC2 may be formed. The recessed regions may also be described as recesses. Here, the topmost surface of the sacrificial layer SL may be located at substantially the same level as the top surface of the mask pattern MP. In an embodiment, the top surface of the sacrificial layer SL on the third region RG3 may be located at substantially the same level as the top surface of the mask pattern MP. The first recessed region RC1 may overlap the first enlarged region ERG1 in the fourth direction D4, e.g., in a vertical direction. The second recessed region RC2 may overlap the second enlarged region ERG2 in the fourth direction D4, e.g., in a vertical direction. In an embodiment, the largest depth H1 of the first recessed region RC1 in the fourth direction D4 may be larger than the largest depth H2 of the second recessed region RC2 in the fourth direction D4. The difference between the largest depths H1 and H2 of the first and second recessed regions RC1 in the fourth direction D4 may result from the afore-described process of etching a portion of the sacrificial material (e.g., in a wet-etching manner). However, in an embodiment, the second recessed region RC2 may not be formed. For example, an uppermost portion of the sacrificial layer SL, which vertically overlaps the second enlarged region ERG2 in the fourth direction D4, may have a flat top surface.

Figure 5A:
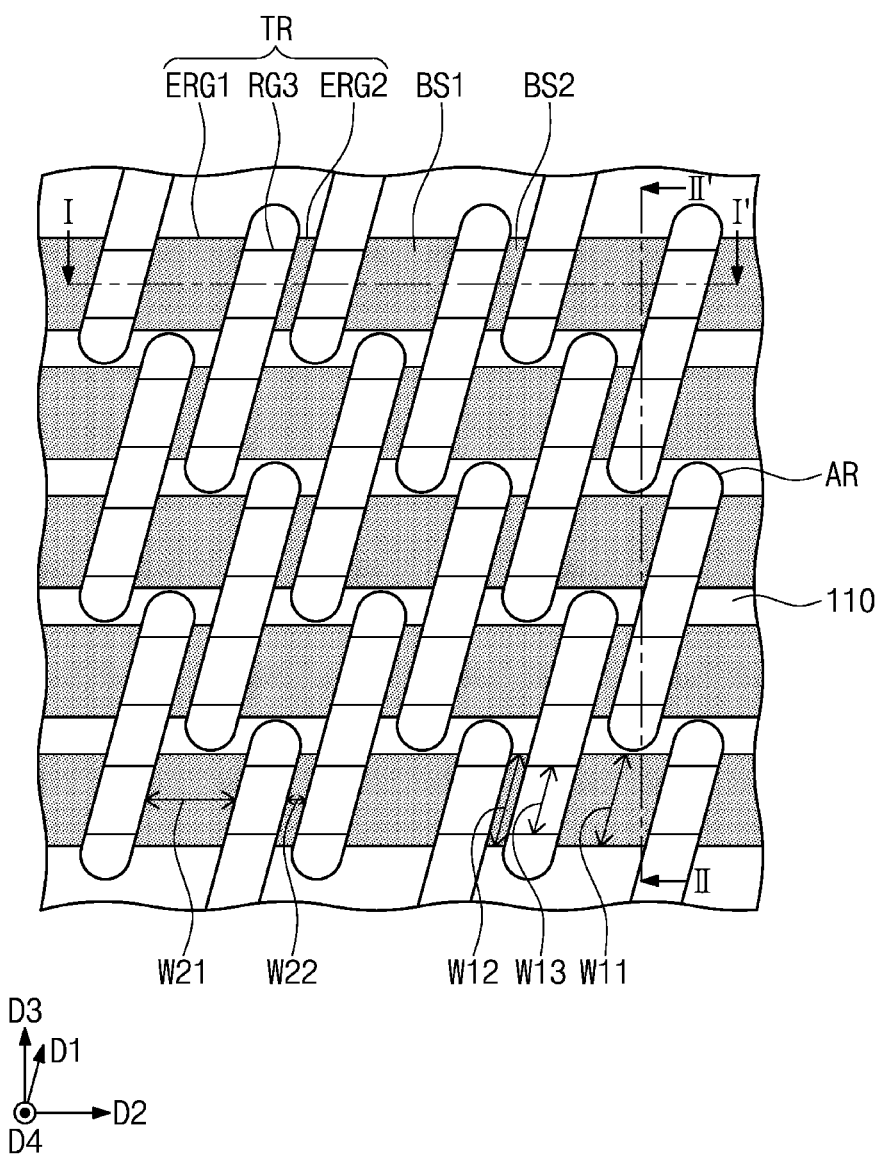
Figure 5B:
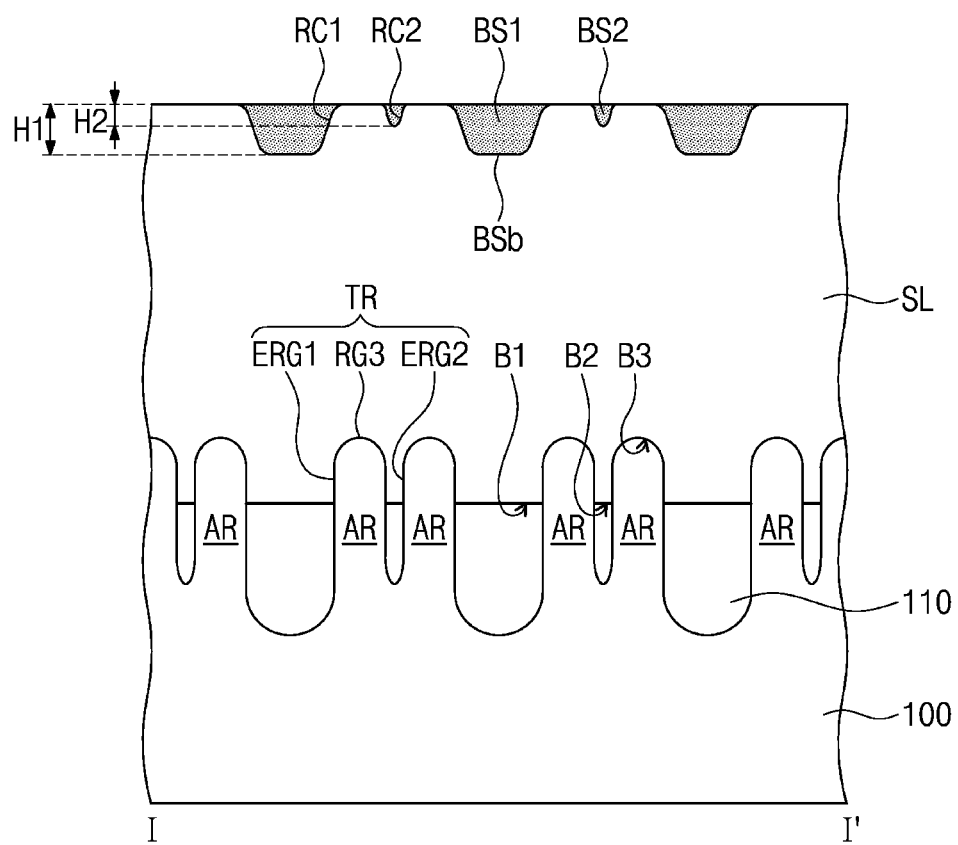
Figure 5C:
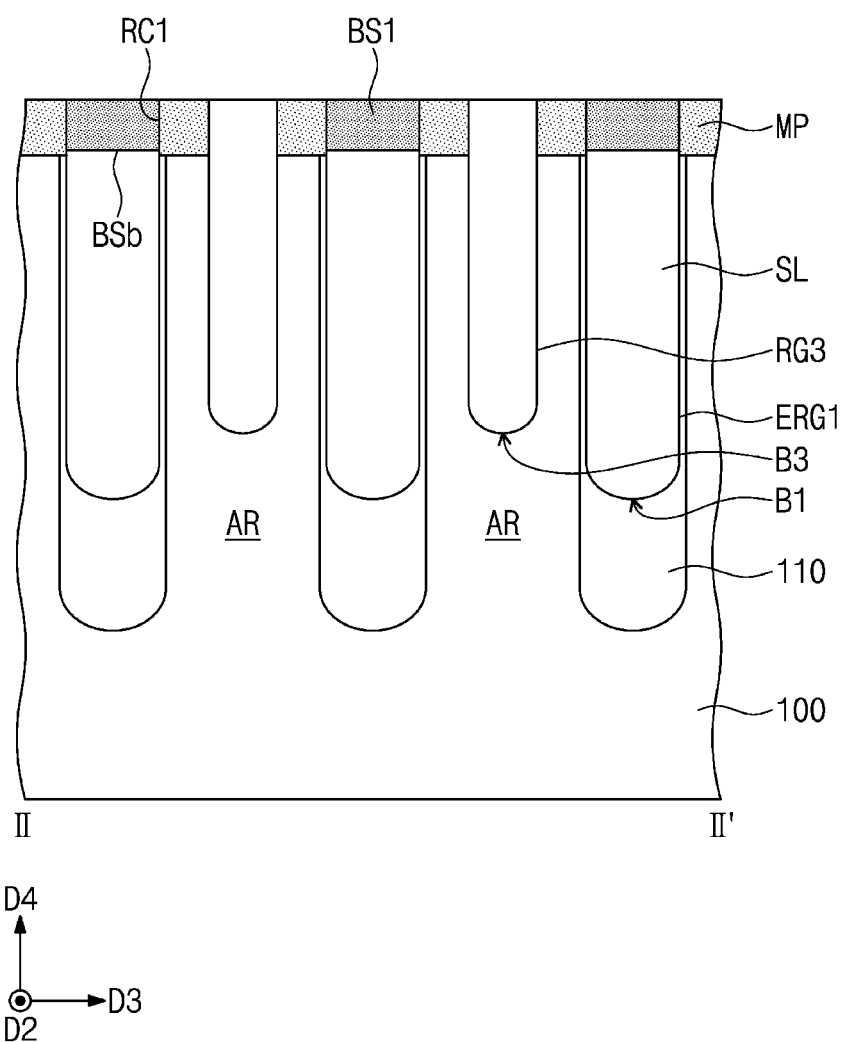

Referring to FIGS. 5A, 5B, and 5C, a first support pattern BS1 and a second support pattern BS2 may be formed to fill the first recessed region RC1 and the second recessed region RC2, respectively, which are defined by the top surface of the sacrificial layer SL. Though described in the singular, a plurality of first support patterns BS1 and plurality of second support patterns BS2 may be formed. The first and second support patterns BS1 and BS2 may be formed of or include, for example, silicon nitride (SiNx). However, the inventive concept is not limited to this example, and in an embodiment, the first and second support patterns BS1 and BS2 may be formed of a material having an etch selectivity with respect to the material of the sacrificial layer SL. The first and second support patterns BS1 and BS2 may be surrounded by the sacrificial layer SL. For example, the first and second support patterns BS1 and BS2 may be surrounded by the sacrificial layer SL on their side and bottom surfaces where they contact the sacrificial layer SL. The term "contact" as used here in relation to physical structures, refers to a direct connection (i.e., touching), unless the context clearly states otherwise. A portion of a side surface of each of the first and second support patterns BS1 and BS2 may be in contact with the mask pattern MP. The first and second support patterns BS1 and BS2 may be described as having side surfaces that extend in the third direction D3 and side surfaces that extend in the second direction D2. The side surfaces that extend in the second direction D2 may be also described as end surfaces. These end surfaces may contact the mask pattern MP, as shown, for example in FIG. 5C. The first and second support patterns BS1 and BS2 may have top surfaces that are located at substantially the same level as the topmost surface of the sacrificial layer SL and the top surface of the mask pattern MP. For example, the top surfaces of the first and second support patterns BS1 and BS2 may be coplanar with the topmost surface of the sacrificial layer SL and the top surface of the mask pattern MP. The first support pattern BS1 may overlap the first enlarged region ERG1 in the fourth direction D4. The second support pattern BS2 may overlap the second enlarged region ERG2 in the fourth direction D4. A width of the first support pattern BS1 in the first direction D1 may be substantially equal to a width of the second support pattern BS2 in the first direction D1. A width of the first support pattern BS1 in the second direction D2 may be larger than a width of the second support pattern BS2 in the second direction D2. A thickness of the first support pattern BS1 in the fourth direction D4 may be larger than a thickness of the second support pattern BS2 in the fourth direction D4. For example, a volume of the first support pattern BS1 may be larger than a volume of the second support pattern BS2. However, in an embodiment, the second support pattern BS2 may not be formed.

A bottom surface BSb of the first support pattern BS1 may be located at a level higher than the bottom surfaces of the trenches TR. The bottom surface BSb of the first support pattern BS1 may be located at a level lower than the top surface of the mask pattern MP. In an embodiment, the bottom surface BSb of the first support pattern BS1 may be located at a level higher than the topmost surface of the active regions AR and the bottom surface of the mask pattern MP. Additionally, although not illustrated in the drawings, in an embodiment, the bottom surface BSb of the first support pattern BS1 may be located at a level lower than the topmost surface of the active regions AR and the bottom surface of the mask pattern MP. In the case where the bottom surface BSb of the first support pattern BS1 is located at a level lower than the bottom surface of the mask pattern MP, the side surface of the first support pattern BS1 (e.g., an end surface) may be in contact with the side surface of the device isolation layer 110. The bottom surface BSb of the first support pattern BS1 may have substantially the same profile as the bottom surface of the first recessed region RC1. For example, the profile of the bottom surface BSb of the first support pattern BS1 may vary depending on what method is used for the gap-fill process. In the sectional view of FIG. 5B, the bottom surface BSb of the first support pattern BS1 may include a portion parallel to the top surface of the substrate 100 and other portions inclined to the top surface of the substrate 100. For example, in the sectional view of FIG. 5B, the bottom surface BSb of the first support pattern BS1 may include a central portion or region that has a dominant common surface that is parallel to the top surface of the substrate 100 and other side portions that are inclined with respect to the top surface of the substrate 100. However, the portion of the bottom surface BSb parallel to the top surface of the substrate 100 may be reduced or absent, depending on the method used for the gap-fill process.

Figure 6A:
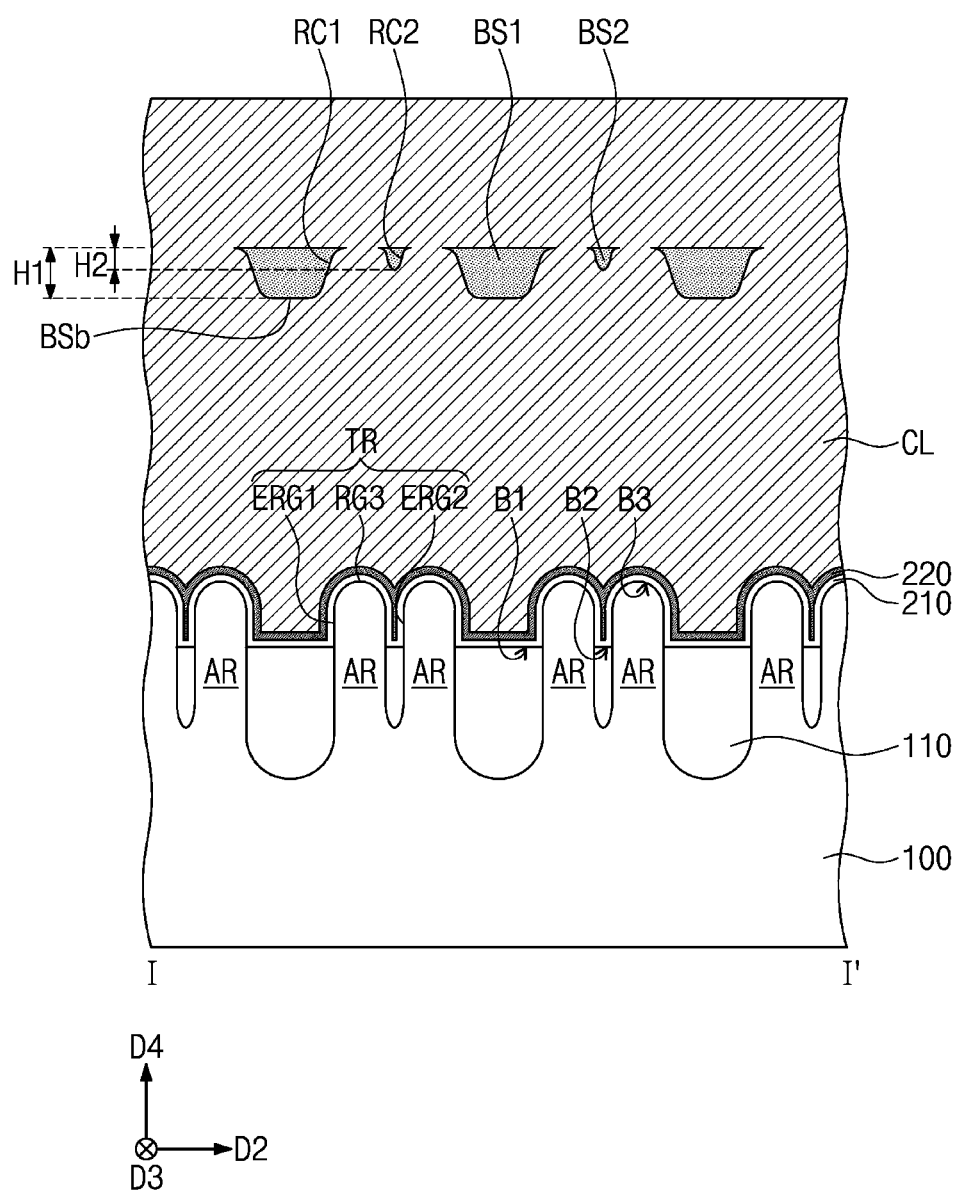
Figure 6B:
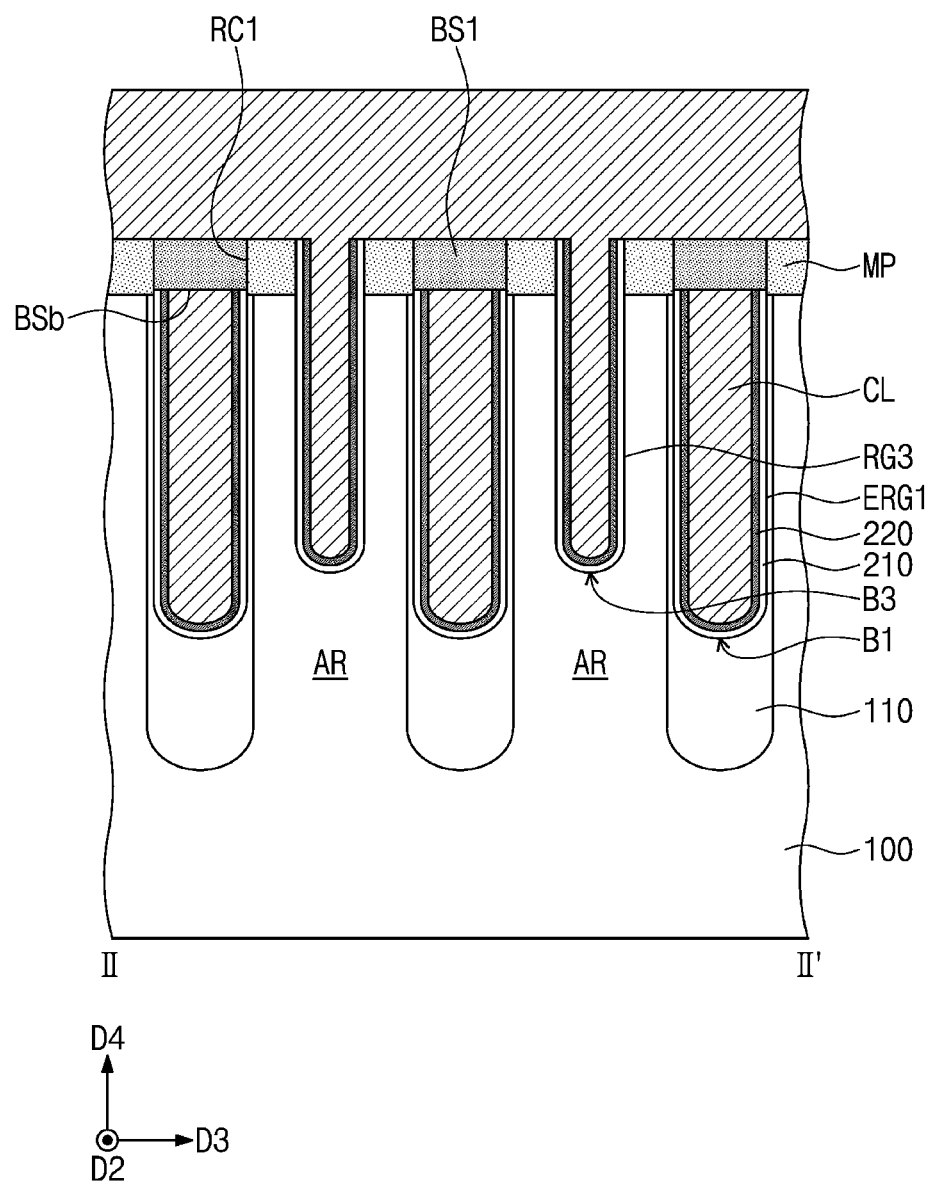
Figure 7A:
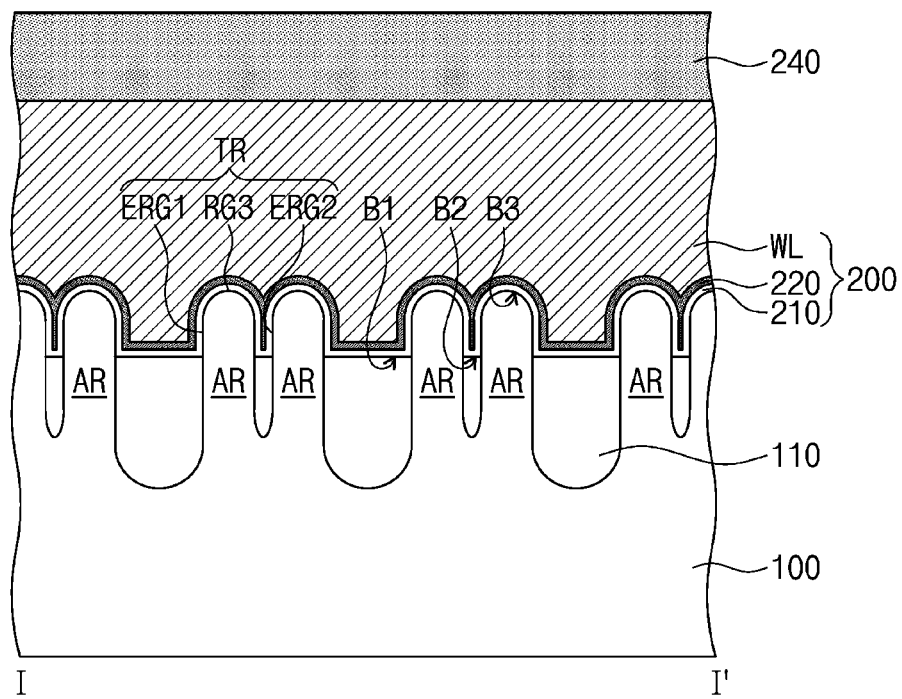
Figure 7A:
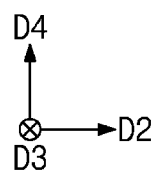
Figure 7B:
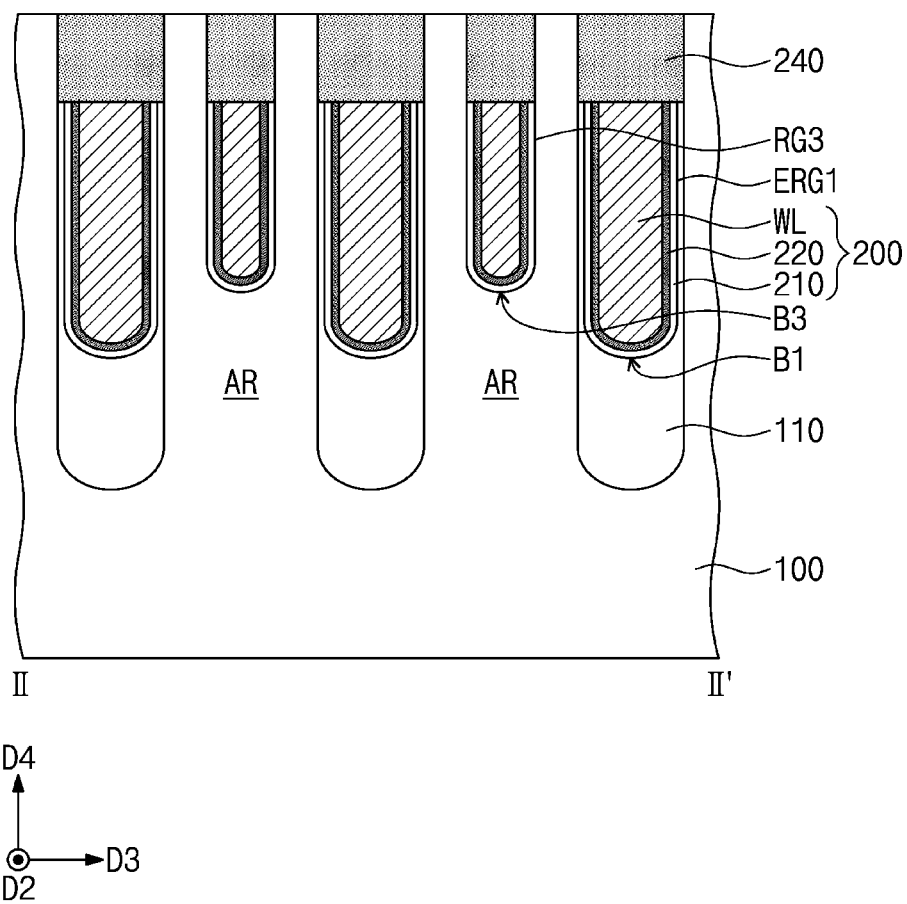

Referring to FIGS. 6A and 6B, the sacrificial layer SL (e.g., see FIGS. 5A to 5C) may be removed, and then, a conductive layer CL may be formed. The conductive layer CL may have a top surface that is located at a higher level (elevation/height) than the top surface of the mask pattern MP, the top surface of the first support pattern B 51, and the top surface of the second support pattern BS2. In an embodiment, the conductive layer CL may be formed to completely fill the trenches TR. The conductive layer CL may be formed of or include a conductive material. For example, the conductive layer CL may be formed of or include at least one of doped poly silicon, metallic materials, or metal silicides. In an embodiment, the conductive layer CL may be formed of or include at least one of tungsten (W), titanium (Ti), tantalum (Ta), copper (Cu), or tungsten nitride (WN).

In an etching process of removing the sacrificial layer SL (e.g., see FIGS. 5A to 5C), the first and second support patterns BS1 and BS2 may not be removed. Due to a difference in etch rate between the first and second support patterns BS1 and BS2 and the sacrificial layer SL (e.g., see FIGS. 5A to 5C), the sacrificial layer SL (e.g., see FIGS. 5A to 5C) may be selectively etched. For example, the etching process may be a wet etching process, which is performed using etching solution.

Between the steps of removing the sacrificial layer SL (e.g., see FIGS. 5A to 5C) and of forming the conductive layer CL, a gate insulating pattern 210 and a first barrier pattern 220 may be formed to conformally cover the bottom and side surfaces of the trenches TR. The gate insulating pattern 210 may be interposed between the conductive layer CL and the device isolation layer 110 and between the conductive layer CL and the active regions AR. The gate insulating pattern 210 may separate the substrate 100 and the conductive layer CL from each other. The gate insulating pattern 210 may be formed of or include at least one of, for example, silicon oxide ($SiO_x$), silicon nitride ($SiN_x$), or silicon oxynitride (SiON). The first barrier pattern 220 may be interposed between the conductive layer CL and the gate insulating pattern 210. The first barrier pattern 220 may separate the gate insulating pattern 210 and the conductive layer CL from each other. The first barrier pattern 220 may be formed of or include at least one of, for example, TiN, Ti/TiN, TiSiN, TaN, or WN.

Referring to FIGS. 6A, 6B, 7A, and 7B, the first and second support patterns BS1 and BS2 and the mask pattern MP may be removed by an etching process. In addition, the etching process may be performed to remove a portion of the conductive layer CL, a portion of the gate insulating pattern 210, and a portion of the first barrier pattern 220, which are each located at a level higher than the topmost surface of the active regions AR. For example, the etching process may be performed to expose the topmost surface of the active regions AR. However, in an embodiment, the etching process may be performed to expose the top surfaces of the first and second support patterns BS1 and BS2. This will be described in more detail with reference to FIGS. 9A and 9B.

The conductive layer CL may be partially removed to form word lines WL. The word lines WL may have top surfaces that are located at a level lower than the topmost surface of the active regions AR. A capping pattern 240 may be formed on the word lines WL. The capping pattern 240 may completely fill the trenches TR provided with the word lines WL. The capping pattern 240 may have a top surface that is located at substantially the same level as the topmost surface of the active regions AR. For example, the top surface of the capping pattern 240 may be coplanar with the topmost surface of the active regions AR. The capping pattern 240 may be in contact with the top surfaces of the word lines WL exposed by the etching process. The capping pattern 240 may be in contact with the side surfaces of the active regions AR and the side surface of the device isolation layer 110, which are exposed by the etching process. The capping pattern 240 may be formed of or include at least one of, for example, silicon oxide ($SiO_x$), silicon nitride ($SiN_x$), or silicon oxynitride (SiON).

Figure 8A:
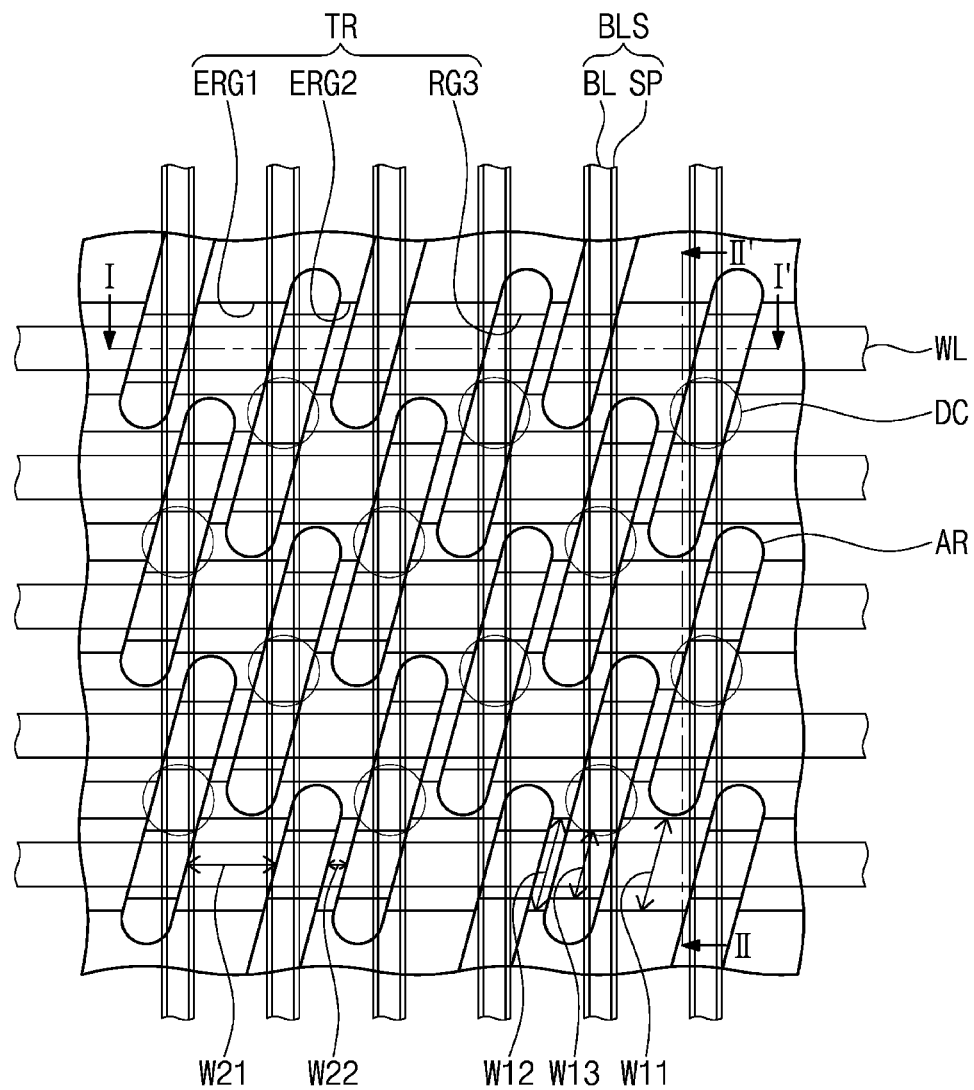
Figure 8B:
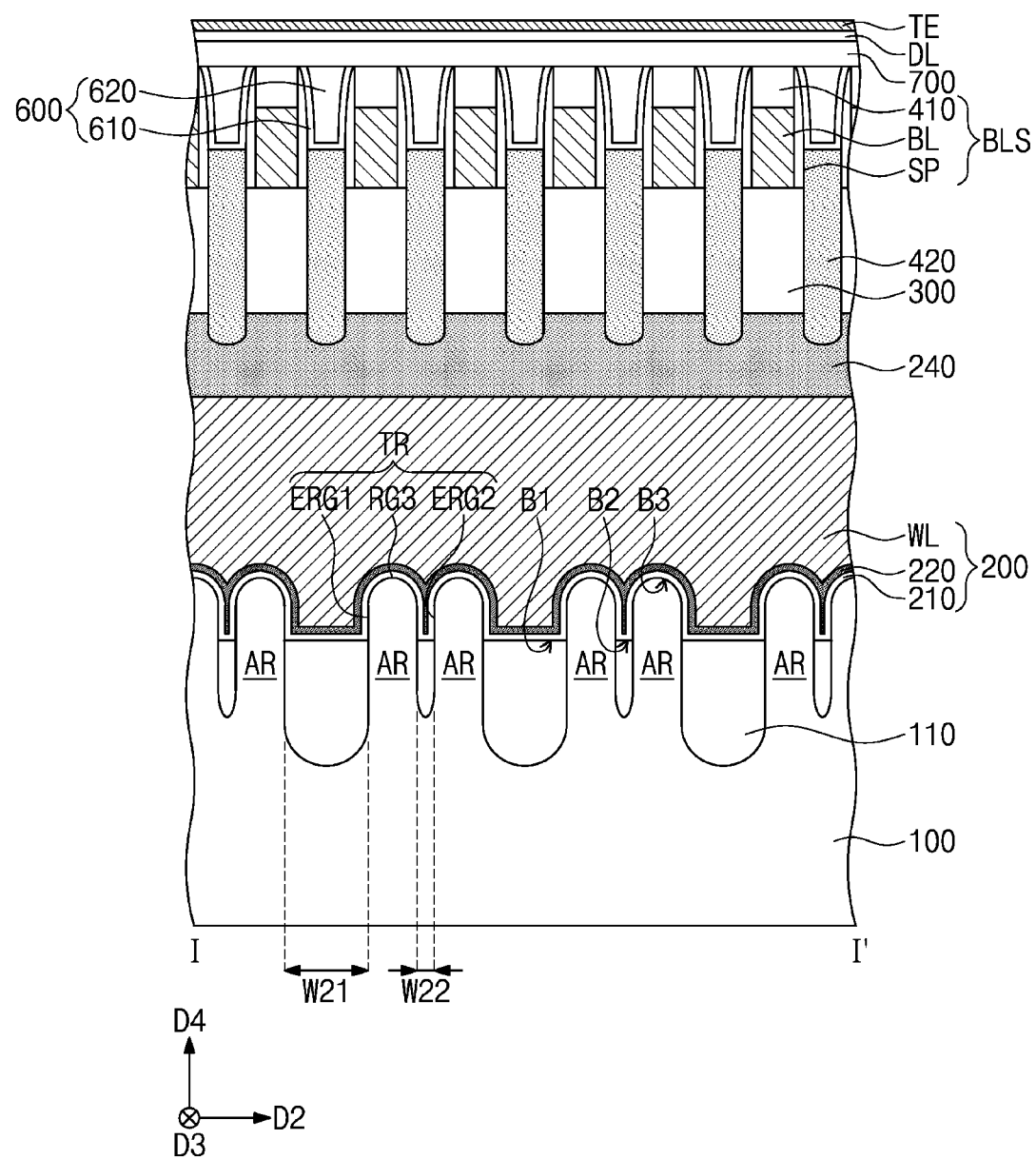
Figure 8C:
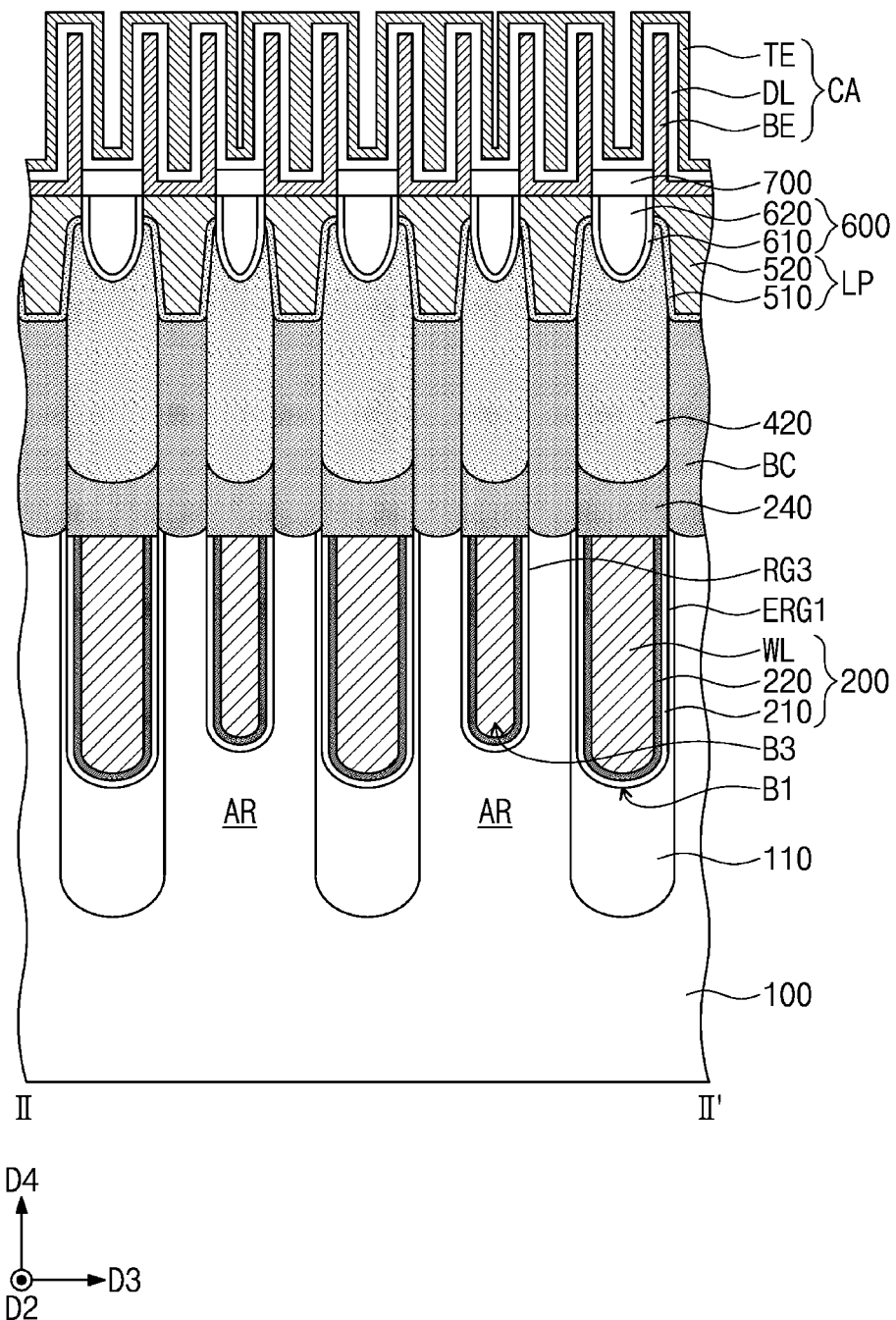

Referring to FIGS. 8A, 8B, and 8C, a fabrication method according to an embodiment of the inventive concept may further include sequentially forming an interlayered insulating layer 300, a first contact DC, bit line structures BLS, a first isolation pattern 420, a second contact BC, a landing pad LP, a second isolation pattern 600, and data storing elements CA on the substrate 100.

First, the interlayered insulating layer 300 may be formed to cover the top surface of the substrate 100 and the top surface of the capping pattern 240. Next, the first contact DC may be formed by etching a portion of the substrate 100 and a portion of the interlayered insulating layer 300 and filling the etched portions with a conductive material. The first contact DC may be in contact with one of the active regions AR of the substrate 100.

The formation of the bit line structures BLS may include sequentially forming a conductive material and an insulating material on the substrate 100 and patterning the conductive material using the insulating material as an etch mask. Here, the insulating material may include a plurality of patterns, which are extended in the third direction D3 and are spaced apart from each other in the second direction D2. A first insulating pattern 410 and a bit line BL may be formed, as a result of the patterning process. In an embodiment, the bit line BL may be extended in the third direction D3 to cross the active regions AR of the substrate 100. The bit line BL may be in contact with the interlayered insulating layer 300 and the first contact DC. The bit line BL may be electrically connected to the first contact DC. In an embodiment, the patterning process may be performed to etch not only the conductive material but also a portion of the first contact DC. The formation of the bit line structures BLS may further include forming a spacer SP to cover a side surface of the bit line BL and a side surface of the first insulating pattern 410. For example, the formation of the bit line structures BLS may further include forming spacers SP to cover side surfaces of respective bit line BL and side surfaces of the first insulating pattern 410.

The formation of the first isolation pattern 420 may include filling a region between respective adjacent bit line structures of the bit line structures BLS with an insulating material, etching the insulating material on a region, in which the word lines WL intersect the region between the bit line structures BLS, to form openings, filling the openings with a material having an etch selectivity with respect to the insulating material, and etching the insulating material on another region exclusive of the location of the openings. In this case, the first isolation pattern 420 may be formed on a region, in which the word lines WL intersect the region between the bit line structures BLS adjacent to each other. For example, the first isolation pattern 420 may be formed in respective regions between respectively adjacent pairs of bit line structures BLS of a plurality of bit line structures BLS.

The formation of the second contact BC may include etching a portion of the active region AR and filling the etched portion of the active region AR with a conductive material. A portion of the device isolation layer 110, which is in contact with the side surface of the active region AR, may also be etched, during the etching of the portion of the active regions AR. The etching process may be performed by, for example, an ion plasma etching (IPE) process. The second contact BC may be formed in a region, which is surrounded by adjacent word lines WL of a plurality of word lines WL and adjacent bit line structures BLS of a plurality of bit line structures BLS. The second contact BC may be in contact with an end portion of the active region AR of the substrate 100.

The formation of the landing pad LP and the second isolation pattern 600 may include sequentially forming a barrier layer and a conductive layer on the second contact BC and the first isolation pattern 420, patterning the barrier layer and the conductive layer to form openings, and filling the openings with an insulating material. The formation of the second isolation pattern 600 may further include performing a planarization process on the insulating material, after filling the openings with the insulating material. The planarization process may be performed by, for example, a chemical mechanical polishing (CMP) process or an etch-back process. A second barrier pattern 510 and a conductive pattern 520 may be formed, as a result of the patterning of the barrier layer and the conductive layer. The openings may be filled with different insulating materials. For example, the second isolation pattern 600 may be formed to include a second insulating pattern 610 and a third insulating pattern 620.

Thereafter, a bottom electrode BE, which may be shaped like a cylinder with a closed bottom or a cup, may be formed on the landing pad LP. Next, a dielectric layer DL and a top electrode TE may be sequentially formed to conformally cover the bottom electrode BE. Thus, the data storing elements CA, each of which includes the bottom and top electrodes BE and TE spaced apart from each other and the dielectric layer DL interposed between the bottom and top electrodes BE and TE, may be formed.

Hereinafter, a semiconductor device fabricated by a method in accordance with example embodiments of the inventive concept will be described in more detail with reference to FIGS. 8A, 8B, and 8C.

Referring to FIGS. 8A, 8B, and 8C, the substrate 100 may be provided, and in an embodiment, the device isolation layer 110 may be formed in an upper portion of the substrate 100. The substrate 100 may be a bulk silicon substrate, a silicon-on-insulator (SOI) substrate, a germanium substrate, a germanium-on-insulator (GOI) substrate, a silicon-germanium substrate, or a substrate including an epitaxial layer grown using a selective epitaxial growth (SEG) technique, for example.

The device isolation layer 110 may be formed of or include an insulating material. For example, the device isolation layer 110 may be formed of or include at least one of silicon oxide ($SiO_x$), silicon nitride ($SiN_x$), or silicon oxynitride (SiON). The device isolation layer 110 may be formed to define the active regions AR of the substrate 100. The active regions AR may have an elongated bar shape. The active regions AR may extend in the first direction D1, for example, so that the bar shape extends lengthwise in the first direction D1. The active regions AR may be parallel to each other.

The source and drain regions may be provided in each of the active regions AR of the substrate 100. The source and drain regions may have a different conductivity type from that of the substrate 100. For example, in the case where the substrate 100 is of p type, the source and drain regions may be of n type.

The trenches TR may be provided to cross the active regions AR of the substrate 100. In an embodiment, each of the active regions AR may intersect a pair of the trenches TR. For example, a pair of trenches TR may cross over and/or cross through each active region AR of a plurality of active regions AR. Additionally, respective trenches may intersect the corresponding active regions off angle, e.g., at an angle different than 90 degrees. Gate lines 200 may be provided in the trenches TR, respectively. The gate lines 200 may fill the trenches TR. When viewed in a plan view, the trenches TR may extend in the second direction D2. The gate lines 200 may extend in the second direction D2 to cross the active regions AR. Each of the trenches TR may include the first enlarged region ERG1, the second enlarged region ERG2, and the third region RG3, for example.

In each of the trenches TR, the first and second enlarged regions ERG1 and ERG2 may be defined as respective portions, which are each located between active regions AR and located at a level lower than the topmost surface of the active region AR. The third region RG3 may be defined as a portion of the active region AR located between the first and second enlarged regions ERG1 and ERG2. In this embodiment, the bottom surface B1 of the first enlarged region ERG1 and the bottom surface B2 of the second enlarged region ERG2 may be defined by the device isolation layer 110, and the bottom surface of the third region RG3 may be defined by the corresponding top surface of the active regions AR beneath the third region RG3 in the fourth direction D4. As an example, the bottom surface B1 of the first enlarged region ERG1 and the bottom surface B2 of the second enlarged region ERG2 may be located at substantially the same level. In addition, the bottom surface B1 of the first enlarged region ERG1 and the bottom surface B2 of the second enlarged region ERG2 may be located at a level lower than the bottom surface B3 of the third region RG3.

The bottom surface B1 of the first enlarged region ERG1, the bottom surface B2 of the second enlarged region ERG2, and the bottom surface B3 of the third region RG3 may not be flat. As shown in the sectional view of FIG. 8B, a width of the bottom surface B3 of the third region RG3 measured in the second direction D2 may decrease in the fourth direction D4. As shown in the sectional view of FIG. 8C, a width of the bottom surface B1 of the first enlarged region ERG1 and a width of the bottom surface B3 of the third region RG3 measured in the third direction D3 may decrease in the fourth direction D4.

If a measurement is performed while proceeding in the second direction D2, the widths of the trenches TR measured in the first and third directions D1 and D3 may not be uniform. In detail, the widths W11 and W12 of the first and second enlarged regions ERG1 and ERG2 measured in the first direction D1 may be larger than the width W13 of the third region RG3 measured in the first direction D1. That is, the first and second enlarged regions ERG1 and ERG2 may refer to regions, which are extended from regions between the active regions AR in the first direction D1 and a direction opposite to the first direction D1. As an example, the width W11 of the first enlarged region ERG1 and the width W12 of the second enlarged region ERG2 measured in the first direction D1 may be substantially equal to each other. In addition, a width W21 of the first enlarged region ERG1 in the second direction D2 may be larger than a width W22 of the second enlarged region ERG2 in the second direction D2. Accordingly, as shown in the plan view of FIG. 8A, the first enlarged region ERG1 may have an area that is larger than that of the second enlarged region ERG2. In addition, a width of the first enlarged region ERG1 in the third direction D3 may be larger than a width of the third region RG3 in the third direction D3. Accordingly, as shown in the plan view of FIG. 8A, the first enlarged region ERG1 may be an area larger than that of the third region RG3.

The gate lines 200 may be provided in the trenches TR to extend in the second direction D2. The gate lines 200 may be extended in the second direction D2 to cross the active regions AR. The gate lines 200 may be buried in the active regions AR of the substrate 100. The top surfaces of the gate lines 200 may be located at a level lower than the topmost surface of the active regions AR. For example, the gate line 200 may be a buried gate line.

The gate lines 200 may include the word lines WL, the gate insulating pattern 210, and the first barrier pattern 220. The word lines WL may fill at least a portion of the trench TR. The word lines WL may be formed of or include a conductive material. For example, the word lines WL may be formed of or include at least one of doped poly silicon, metallic materials, or metal silicides. For example, the word lines WL may be formed of or include at least one of tungsten (W), titanium (Ti), tantalum (Ta), copper (Cu), or tungsten nitride (WN).

The gate insulating pattern 210 may be interposed between the side surface of each of the word lines WL and the substrate 100 and between the bottom surface of each of the word lines WL and the substrate 100. The gate insulating pattern 210 may conformally cover the top surfaces of the active regions AR and the top surface of the device isolation layer 110 exposed by the trenches TR. For example, the gate insulating pattern 210 may separate the substrate 100 from the word lines WL. The gate insulating pattern 210 may have a "U"-shaped section, but the section of the gate insulating pattern 210 may vary depending on the shapes of the word lines WL and the trenches TR. The gate insulating pattern 210 may be formed of or include at least one of, for example, silicon oxide ($SiO_x$), silicon nitride ($SiN_x$), or silicon oxynitride (SiON).

The first barrier pattern 220 may be interposed between the word lines WL and the gate insulating pattern 210. The first barrier pattern 220 may conformally cover the top surface of the gate insulating pattern 210. For example, the first barrier pattern 220 may separate the gate insulating pattern 210 and the word lines WL from each other. The first barrier pattern 220 may have a "U"-shaped section, and in some embodiments, the section of the first barrier pattern 220 may vary depending on the shape of the word lines WL and the shape of the gate insulating pattern 210. The first barrier pattern 220 may be formed of or include at least one of, for example, TiN, Ti/TiN, TiSiN, TaN, or WN.

The capping pattern 240 may be provided on the top surfaces of the gate lines 200. A bottom surface of the capping pattern 240 may be positioned at substantially the same level as the top surfaces of the word lines WL. For example, the bottom surface of the capping pattern 240 may be coplanar with the top surfaces of the word lines WL. The side surface of the capping pattern 240 may be in contact with the active regions AR, the device isolation layer 110, and/or the second contact BC. The capping pattern 240 may be formed of or include at least one of, for example, silicon oxide ($SiO_x$), silicon nitride ($SiN_x$), or silicon oxynitride (SiON).

Although not shown, a buffer pattern may be provided on the top surface of the substrate 100. The buffer pattern may include a single insulating layer or a plurality of insulating layers. The buffer pattern may be formed of or include at least one of, for example, silicon oxide ($SiO_x$), silicon nitride ($SiN_x$), or silicon oxynitride (SiON).

The first contacts DC may be respectively provided on the active regions AR of the substrate 100. As an example, each of the first contacts DC may be a bit line node contact. The first contact DC may be extended in the fourth direction D4, when viewed in a sectional view. The first contact DC may be electrically connected to one of the source and drain regions, which are provided in each of the active regions AR of the substrate 100. The first contact DC may be formed of or include a conductive material. For example, the first contact DC may be formed of or include at least one of metallic materials, metal nitrides, metal silicides, or poly silicide.

The bit line structures BLS may be provided to cross the active regions AR of the substrate 100 in the third direction D3. The bit line structures BLS may be spaced apart from each other in the second direction D2. Each of the bit line structures BLS may be electrically connected to the first contact DC. In addition, the interlayered insulating layer 300 may be provided between the bit line structures BLS and the substrate 100. The interlayered insulating layer 300 may be provided to surround the side surface of the first contact DC. The interlayered insulating layer 300 may be formed of or include at least one of, for example, silicon oxide ($SiO_x$), silicon nitride ($SiN_x$), or silicon oxynitride (SiON).

Each of the bit line structures BLS may include the bit line BL, the first insulating pattern 410, and the spacer SP, which may be sequentially stacked on the substrate 100, and in this embodiment, the spacer SP may cover the side surface of the bit line BL and the side surface of the first insulating pattern 410. The bit line BL may be formed of or include a conductive material. For example, the bit line BL may be formed of or include at least one of doped poly silicon, metallic materials, or metal silicides. The first insulating pattern 410 may be formed of or include, for example, silicon oxide. In an embodiment, the spacer SP may include a plurality of layers. For example, the spacer SP may include a layer containing silicon oxide ($SiO_x$) and a layer containing silicon nitride ($SiN_x$). The spacer SP may have a decreasing width in the fourth direction D4.

Although not shown, the bit line BL may include a first conductive pattern and a second conductive pattern. The second conductive pattern may be provided between the first conductive pattern and the first insulating pattern 410. The first conductive pattern may include, for example, poly silicon or doped poly silicon. The second conductive pattern may be formed of or include at least one of, for example, tungsten (W), aluminum (Al), copper (Cu), nickel (Ni), or cobalt (Co). Although not shown, a diffusion barrier layer may be interposed between the first conductive pattern and the second conductive pattern.

When viewed in a plan view, the second contact BC may be provided in a region, that is surrounded by adjacent word lines of a plurality of word lines WL and adjacent bit line structures of a plurality of bit line structures BLS. In an embodiment, the second contact BC may serve as a storage node contact. The second contact BC may be in contact with an end portion of the active region AR of the substrate 100. In detail, the second contact BC may be electrically connected to the source and drain region, which is provided in each of the active regions AR. The second contact BC may be provided on the active regions AR and may be extended in the fourth direction D4. In an embodiment, a portion of the second contact BC may overlap the spacer SP in the fourth direction D4. In an embodiment, a portion of the second contact BC may overlap the device isolation layer 110 in the fourth direction D4. A top surface of the second contact BC may be positioned at a level lower than a top surface of the first insulating pattern 410. The bottom surface of the second contact BC may be located at a level higher than the bottom surface of the first contact DC. The second contact BC may be formed of or include at least one of, for example, metallic materials, metal nitrides, metal silicides, or poly silicon.

When viewed in a plan view, the first isolation pattern 420 may be provided on a region, in which the word lines WL intersect the region between the bit line structures BLS adjacent to each other. The first isolation pattern 420 may be formed of or include at least one of, for example, SiBCN, SiCN, SiOCN, or SiN.

The landing pad LP may be provided on the top surface of the second contact BC. The landing pad LP may be electrically connected to the second contact BC. In an embodiment, a portion of the landing pad LP may be in contact with a top surface of a respective bit line structure of the bit line structures BLS. The landing pad LP may include the second barrier pattern 510 and the conductive pattern 520, which are sequentially stacked on the second contact BC. The second barrier pattern 510 may be provided between the conductive pattern 520 and the second contact BC and also be between the conductive pattern 520 and the first isolation pattern 420. For example, the second barrier pattern 510 may include at least one of TiN, Ti/TiN, TiSiN, TaN, and WN. The conductive pattern 520 may include at least one type of metallic material. For example, the conductive pattern 520 may be formed of or include at least one of tungsten (W), titanium (Ti), tantalum (Ta), copper (Cu), or tungsten nitride (WN).

The second isolation pattern 600 may be provided between adjacent landing pads of a plurality of landing pads LP. The second isolation pattern 600 may surround an outer side surface of the landing pads LP. Bottom and side surfaces of the second isolation pattern 600 may contact at least one of the first isolation pattern 420, the second barrier pattern 510, and the conductive pattern 520. In some embodiments, bottom and side surfaces of the second isolation pattern 600 may contact each of the first isolation pattern 420, the second barrier pattern 510, and the conductive pattern 520. A top surface of the second isolation pattern 600 may be positioned at substantially the same level as a top surface of the landing pad LP. For example, the top surface of the second isolation pattern 600 may be coplanar with the top surface of the landing pad LP. The second isolation pattern 600 may include the second insulating pattern 610 and the third insulating pattern 620. The second insulating pattern 610 may be in contact with the side surfaces of adjacent landing pads of the landing pads LP, the top surface of the first isolation pattern 420, and the side surface of the spacer SP. The second insulating pattern 610 may be formed of or include at least one of, for example, tetraethly orthosilicate (TEOS) or high density plasma (HDP) oxide. The third insulating pattern 620 may be provided in an internal space surrounded by the second insulating pattern 610. The third insulating pattern 620 may be formed of or include at least one of, for example, silicon oxide ($SiO_x$), silicon nitride ($SiN_x$), or silicon oxynitride (SiON).

The data storing elements CA may be provided on the landing pads LP. In an embodiment, the data storing elements CA may be capacitors. Each of the data storing elements CA may include the bottom electrode BE, the dielectric layer DL, and the top electrode TE. The bottom electrode BE may vertically overlap with the landing pad LP and the second contact BC in the fourth direction D4, when viewed in cross section. The bottom electrode BE may be extended from the top surface of the landing pad LP in the fourth direction D4. In an embodiment, the bottom electrode BE may have a cylinder shape with a closed bottom. Although not shown, the bottom electrode BE, which overlaps the bit line structures BLS in the fourth direction D4, may be arranged to form a zigzag shape in the third direction D3. The top electrode TE may conformally cover the bottom electrode BE. For example, the top electrode TE may serve as a common electrode commonly covering a plurality of the bottom electrodes BE. Each of the bottom and top electrodes BE and TE may be formed of or include at least one of doped silicon, metallic materials, or metal compounds. The dielectric layer DL may be interposed between the bottom electrode BE and the top electrode TE. For example, the dielectric layer DL may separate the bottom electrode BE and the top electrode TE from each other. A fourth insulating pattern 700 may be interposed between the dielectric layer DL and the second isolation pattern 600 and also be between the dielectric layer DL and the first insulating pattern 410. The fourth insulating pattern 700 may be formed of or include at least one of, for example, silicon oxide ($SiO_x$), silicon nitride ($SiN_x$), or silicon oxynitride (SiON).

Figure 9A:
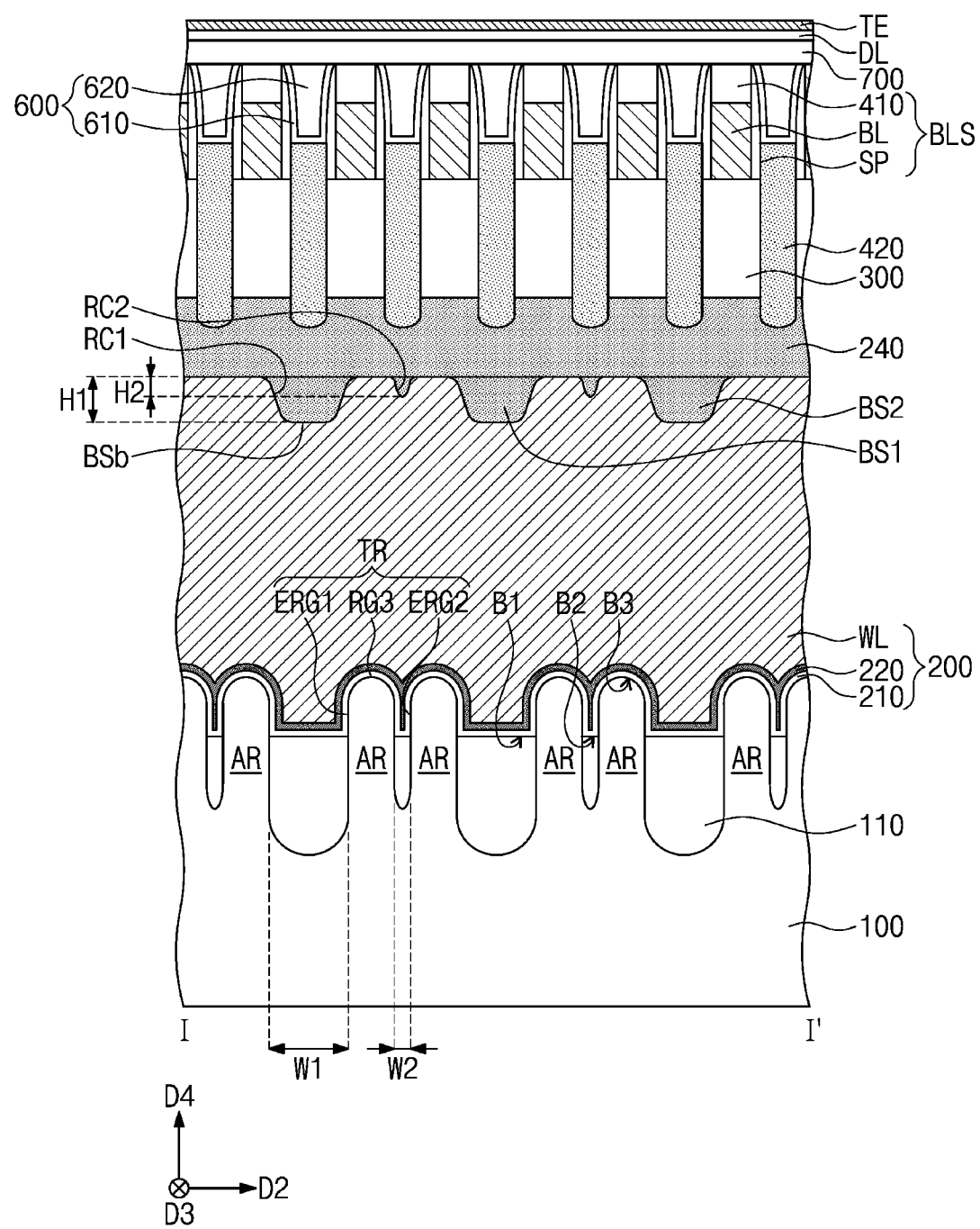
Figure 9B:
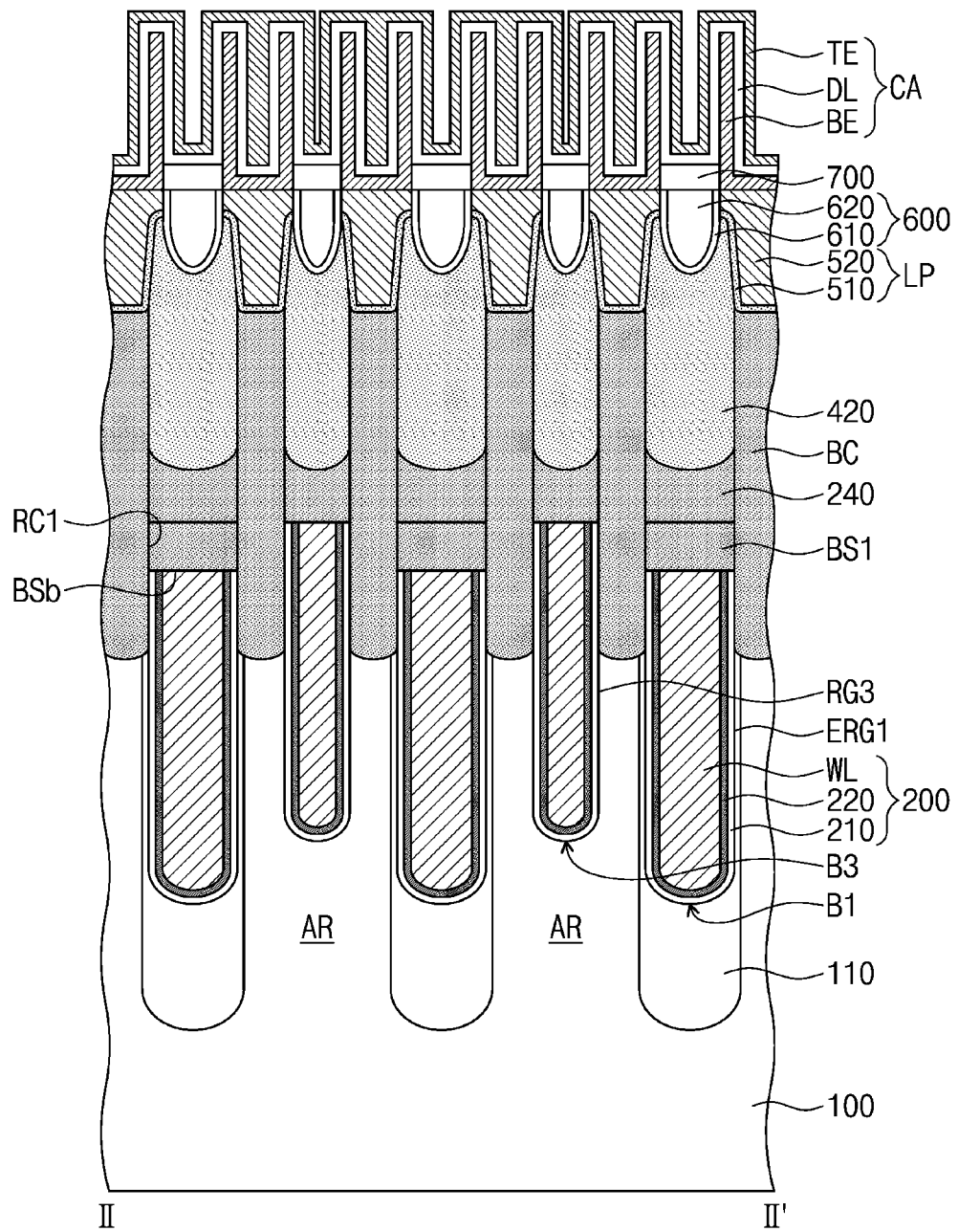

FIGS. 9A and 9B are sectional views, which illustrate a semiconductor device according to an embodiment of the inventive concept and a method of fabricating the same and are taken along lines I-I' and II-II', respectively, of FIG. 8A. For concise description, an element previously described with reference to FIGS. 1A to 8C may be identified by the same reference number without repeating the previous description thereof. When using the same reference number, an element may have the same features and qualities as previously disclosed.

Referring to FIGS. 6A, 6B, 9A, and 9B, a method of fabricating a semiconductor device may include etching the conductive layer CL to expose the top surfaces of the first and second support patterns BS1 and BS2, after the step of forming the conductive layer CL. The word lines WL may be formed through the etching of the conductive layer CL. The first and second support patterns BS1 and BS2 may support the side surfaces of the active regions AR or the side surface of the second contact BC. However, although not shown in the drawings, depending on the process time in the process of etching the conductive layer CL, the second support pattern BS2 may be removed and the first support pattern BS1 may be partially left, e.g., BS1 may partially remain.

The first and second support patterns BS1 and BS2 may be in contact with the top surfaces of the word lines WL, the top surface of the gate insulating pattern 210, the top surface of the first barrier pattern 220, the side surface of the second contact BC, and the bottom surface of the capping pattern 240. The bottom surfaces BSb of the first and second support patterns BS1 and BS2 may have the same profile as that described with reference to FIGS. 5A, 5B, and 5C.

In a method of fabricating a semiconductor device according to an embodiment of the inventive concept, it may be possible to cost-effectively form a support pattern, which is used to support side surfaces of buried gate lines.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming a device isolation layer in a substrate to define a plurality of active regions extending in a first direction;
    forming a trench in an upper portion of the substrate that crosses the active regions in a second direction that intersects the first direction;
    forming a sacrificial layer that fills the trench;
    forming support patterns on the sacrificial layer, wherein the support patterns fill recessed regions provided at a top surface of the sacrificial layer; and
    removing the sacrificial layer,
    wherein the support patterns are spaced apart from each other with the active regions interposed therebetween.

2. The method of claim 1, wherein the trench comprises first regions and second regions, each region of which is formed between adjacent active regions, and third regions, which vertically overlap respectively the active regions,
    the first regions and the second regions are spaced apart from each other,
    a width of each of the first regions in the second direction is larger than a width of each of the second regions in the second direction,
    a width of each of the first regions in the first direction and a width of each of the second regions in the first direction are each larger than a width of each of the third regions in the first direction, and
    each of the first regions vertically overlaps the support pattern.

3. The method of claim 2, wherein the recessed regions comprise first recessed regions, which vertically overlap the first regions, respectively, and second recessed regions, which vertically overlap the second regions, respectively,
    a width of each of the first recessed regions in the second direction is larger than a width of each of the second recessed regions in the second direction, and
    a maximum depth from a topmost surface of the sacrificial layer to a bottom surface of the first recessed regions is greater than a maximum depth from the topmost surface of the sacrificial layer to a bottom surface of the second recessed regions.

4. The method of claim 3, wherein the support patterns comprise first support patterns filling the first recessed regions and second support patterns filling the second recessed regions,
    a bottom surface of each of the first support patterns is located at an elevation that is lower than a bottom surface of each of the second support patterns, and
    the first support patterns and the second support patterns are spaced apart from each other in the second direction.

5. The method of claim 2, wherein the forming of the sacrificial layer comprises:
    filling the trench with a sacrificial material; and
    etching a portion of the sacrificial material, wherein the etching of the portion of the sacrificial material lowers an elevation of a top surface of the sacrificial material that vertically overlaps the first regions.

6. The method of claim 5, wherein the filling of the trench with the sacrificial material is performed through one of a flowable chemical vapor deposition (FCVD) method and a spin coating method.

7. The method of claim 5, wherein the forming of the sacrificial layer further comprises planarizing a portion of the top surface of the sacrificial material, between the filling of the trench with the sacrificial material and the etching of the portion of the sacrificial material.

8. The method of claim 1, further comprising enlarging at least a portion of the trench, between the forming of the trench and the forming of the sacrificial layer.

9. The method of claim 8, wherein the enlarging at least a portion of the trench etches a portion of the device isolation layer exposed through the trench.

10. The method of claim 1, wherein the sacrificial layer includes poly silicon, and the support patterns include silicon nitride.

11. The method of claim 1, further comprising:
forming a conductive layer in a region, from which the sacrificial layer was previously removed;
etching the conductive layer to expose top surfaces of the support patterns; and
forming capping patterns in contact with the top surfaces of the support patterns.

12. A method of fabricating a semiconductor device, comprising:
forming a device isolation layer in a substrate to define a plurality of active regions extending in a first direction;
forming a trench in an upper portion of the substrate, wherein the trench crosses the active regions in a second direction that intersects the first direction;
forming a sacrificial layer that fills the trench;
forming support patterns on the sacrificial layer; and
removing the sacrificial layer,
wherein the forming of the sacrificial layer comprises filling the trench with a sacrificial material and etching a portion of the sacrificial material, and
the support patterns fill recessed regions provided at a top surface of the sacrificial layer.

13. The method of claim 12, wherein the trench comprises first regions and second regions, each region of which is formed between active regions, and third regions, which vertically overlap the active regions, respectively,
a width of each of the first regions in the second direction is larger than a width of each of the second regions in the second direction, and
the first regions vertically overlap the support patterns, respectively.

14. The method of claim 13, wherein a bottom surface of each of the third regions is located at an elevation that is higher than a bottom surface of each first region.

15. The method of claim 13, further comprising enlarging at least a portion of the trench, between the forming of the trench and the forming of the sacrificial layer,
wherein the enlarging of the at least a portion of the trench comprises etching a portion of the device isolation layer, which is exposed through the trench, and increasing a width of each of the first regions in the first direction and increasing a depth of each of the first regions.

16. The method of claim 12, wherein side surfaces of the support patterns are connected to respective side surfaces of the device isolation layer.

17. The method of claim 12, wherein the support patterns are formed on the device isolation layer, and
the support patterns are spaced apart from each other with the active regions interposed therebetween.

18. The method of claim 12, wherein the forming of the trench comprises:
forming a mask pattern on the substrate; and
etching the substrate and the device isolation layer using the mask pattern as an etch mask,
wherein bottom surfaces of the support patterns are located at an elevation that is lower than a top surface of the mask pattern.

19. A method of fabricating a semiconductor device, comprising:
forming a device isolation layer in a substrate to define a plurality of active regions extending in a first direction;
forming trenches in an upper portion of the substrate to cross the plurality of active regions in a second direction that intersects the first direction;
forming a sacrificial layer that fills the trenches;
forming support patterns on the sacrificial layer;
removing the sacrificial layer and exposing the trenches;
forming a plurality of word lines in the trenches;
forming a first contact that is connected to each of the plurality of active regions, and forming a plurality of bit line structures, that are in contact with the first contact and extend in a third direction perpendicular to the second direction;
forming a second contact, at a region between adjacent word lines of the plurality of word lines and adjacent bit line structures of the plurality of bit line structures, wherein the second contact is connected to each of the plurality of active regions; and
forming a data storing element on the second contact,
wherein the support patterns fill recessed regions, which are provided at a top surface of the sacrificial layer,
each of the trenches comprises first regions and second regions, each region of which is formed between adjacent active regions of the plurality of active regions, and third regions, each of which vertically overlaps the active regions,
a width of each of the first regions in the second direction is larger than a width of each of the second regions in the second direction, and
each of the first regions vertically overlaps one of the support patterns.

20. The method of claim 19, wherein the support patterns are connected to top surfaces of the word lines and a side surface of the second contact.

* * * * *